United States Patent
Ikedo

(10) Patent No.: US 11,539,907 B2
(45) Date of Patent: Dec. 27, 2022

(54) IMAGE SENSOR AND IMAGE CAPTURING APPARATUS

(71) Applicant: CANON KABUSHIKI KAISHA, Tokyo (JP)

(72) Inventor: Hideki Ikedo, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 17/723,926

(22) Filed: Apr. 19, 2022

(65) Prior Publication Data

US 2022/0247960 A1 Aug. 4, 2022

Related U.S. Application Data

(63) Continuation of application No. 16/991,129, filed on Aug. 12, 2020, now Pat. No. 11,457,168, which is a
(Continued)

(30) Foreign Application Priority Data

Jan. 5, 2015 (JP) .............................. JP2015-000511
Dec. 10, 2015 (JP) .............................. JP2015-241409

(51) Int. Cl.
*H04N 5/378* (2011.01)
*H04N 13/218* (2018.01)
(Continued)

(52) U.S. Cl.
CPC ............. *H04N 5/378* (2013.01); *G02B 7/34* (2013.01); *H01L 27/14643* (2013.01);
(Continued)

(58) Field of Classification Search
CPC .............. H04N 5/378; H04N 5/23245; H04N 5/23212; H04N 5/3698; H04N 5/3696;
(Continued)

(56) References Cited

U.S. PATENT DOCUMENTS 7,868,283 B2   1/2011   Mabuchi
8,482,640 B2   7/2013   Sugaw et al.
(Continued)

FOREIGN PATENT DOCUMENTS

CN   103108144 A   5/2013
EP   2 871 835 A1   5/2015
(Continued)

OTHER PUBLICATIONS

Cited in an European Search Report dated May 11, 2016, that issued in the corresponding European Patent Application No. 16150174.7. Submitted in grandparent U.S. Appl. No. 16/059,182.
(Continued)

*Primary Examiner* — Pritham D Prabhakher

(74) *Attorney, Agent, or Firm* — Cowan, Liebowitz & Latman, P.C.

(57) ABSTRACT

An image sensor, comprising a pixel region in which a plurality of pixel units are arranged, each pixel unit having first and second photoelectric conversion portions, a first output portion that outputs, outside of the image sensor, a first signal based on a signal from the first photoelectric conversion portion of the pixel units, and a second output portion that outputs a second signal based on a signal from the first photoelectric conversion portion and a signal from the second photoelectric conversion portion of the pixel units, wherein output of the first signal from the first output portion and output of the second signal from the second output portion are performed in parallel.

9 Claims, 13 Drawing Sheets

Related U.S. Application Data continuation of application No. 16/059,182, filed on Aug. 9, 2018, now Pat. No. 10,785,438, which is a continuation of application No. 14/984,465, filed on Dec. 30, 2015, now Pat. No. 10,070,088.

(51) Int. Cl.

| | | |
|---|---|---|
| *H04N 5/369* | (2011.01) | |
| *G02B 7/34* | (2021.01) | |
| *H01L 27/146* | (2006.01) | |
| *H04N 5/232* | (2006.01) | |
| *H04N 5/341* | (2011.01) | |
| *H04N 5/372* | (2011.01) | |
| *H04N 5/374* | (2011.01) | |
| *H04N 5/3745* | (2011.01) | |

(52) U.S. Cl.
CPC ......... *H04N 5/23212* (2013.01); *H04N 5/341* (2013.01); *H04N 5/3698* (2013.01); *H04N 5/36961* (2018.08); *H04N 5/3742* (2013.01); *H04N 5/3745* (2013.01); *H04N 5/37213* (2013.01); *H04N 13/218* (2018.05)

(58) Field of Classification Search
CPC ............. H04N 5/37213; H04N 5/3742; H04N 5/3745; H04N 5/341; H04N 13/0217; G02B 7/34; H01L 27/14643
USPC .................................................... 348/231.99
See application file for complete search history.

(56) References Cited

U.S. PATENT DOCUMENTS

| | | | |
|---|---|---|---|
| 8,482,644 B2 * | 7/2013 | Mori ................. | H01L 27/14603 |
| | | | 348/308 |
| 8,493,483 B2 | 7/2013 | Nishihara | |
| 8,817,139 B2 | 8/2014 | Yanada | |
| 8,890,047 B2 | 11/2014 | Solhusvik et al. | |
| 8,946,610 B2 | 2/2015 | Iwabuchi et al. | |
| 8,964,082 B2 | 2/2015 | Yamada | |
| 8,988,571 B2 | 3/2015 | Sugawa et al. | |
| 9,053,996 B2 | 6/2015 | Iwane et al. | |
| 9,077,921 B2 | 7/2015 | Hashimoto et al. | |
| 9,093,363 B2 | 7/2015 | Sukegawa et al. | |
| 9,154,713 B2 | 10/2015 | Denham et al. | |
| 9,182,107 B2 | 11/2015 | Ekey et al. | |
| 9,191,596 B2 | 11/2015 | Sonoda | |
| 9,270,906 B2 | 2/2016 | Peng et al. | |
| 9,300,859 B2 | 3/2016 | Ise | |
| 9,313,433 B2 | 4/2016 | Nakajima et al. | |
| 9,319,614 B2 | 4/2016 | Shimada | |
| 9,337,222 B2 * | 5/2016 | Saito ................. | H04N 5/3575 |
| 9,344,658 B2 | 5/2016 | Dai et al. | |
| 9,350,930 B2 | 5/2016 | Lee et al. | |
| 9,392,162 B2 | 7/2016 | Tamaki | |
| 9,426,350 B2 | 8/2016 | Konishi | |
| 9,438,839 B2 * | 9/2016 | Hiyama ................. | H04N 5/369 |
| 9,538,110 B2 | 1/2017 | Ikeda | |
| 9,549,139 B2 | 1/2017 | Ikeda et al. | |
| 9,554,115 B2 | 1/2017 | Agranov et al. | |
| 9,571,758 B2 | 2/2017 | Hashimoto et al. | |
| 9,607,971 B2 | 3/2017 | Asayama et al. | |
| 9,609,223 B2 | 3/2017 | Ogushi et al. | |
| 9,609,228 B2 | 3/2017 | Kuboi | |
| 9,712,798 B2 | 7/2017 | Hata | |
| 9,736,410 B2 | 8/2017 | Uchida | |
| 9,762,836 B2 | 9/2017 | Kurose | |
| 9,865,549 B2 | 1/2018 | Shigetoshi | |
| 10,270,999 B2 | 4/2019 | Kusaka | |
| 2003/0206236 A1 | 11/2003 | Levantovsky | |
| 2008/0042046 A1 | 2/2008 | Iwabuchi | |
| 2009/0295954 A1 * | 12/2009 | Mori ...................... | H04N 5/347 |
| | | | 348/294 |
| 2010/0188538 A1 | 7/2010 | Sugawa et al. | |
| 2010/0208115 A1 | 8/2010 | Sugawa et al. | |
| 2010/0276572 A1 | 11/2010 | Iwabuchi et al. | |
| 2011/0080510 A1 * | 4/2011 | Nishihara ............... | H04N 5/355 |
| | | | 348/308 |
| 2011/0109776 A1 | 5/2011 | Kawai | |
| 2012/0293698 A1 | 11/2012 | Sukegawa | |
| 2013/0026343 A1 * | 1/2013 | Saito ................. | H01L 27/14643 |
| | | | 250/208.1 |
| 2013/0056619 A1 * | 3/2013 | Shinohara ......... | H01L 27/14609 |
| | | | 250/208.1 |
| 2013/0063630 A1 | 3/2013 | Yanada et al. | |
| 2013/0068929 A1 | 3/2013 | Solhusvik | |
| 2013/0120624 A1 | 5/2013 | Okita et al. | |
| 2013/0128085 A1 | 5/2013 | Kamada | |
| 2013/0222631 A1 | 8/2013 | Iwane et al. | |
| 2013/0229543 A1 | 9/2013 | Hashimoto et al. | |
| 2013/0229557 A1 | 9/2013 | Hashimoto et al. | |
| 2013/0278804 A1 | 10/2013 | Denham et al. | |
| 2013/0293752 A1 | 11/2013 | Peng et al. | |
| 2013/0320197 A1 | 12/2013 | Asayama et al. | |
| 2014/0028877 A1 * | 1/2014 | Jang ...................... | H04N 5/225 |
| | | | 348/231.99 |
| 2014/0036121 A1 * | 2/2014 | Minowa ................. | H04N 5/378 |
| | | | 348/301 |
| 2014/0078367 A1 | 3/2014 | Sonoda | |
| 2014/0146208 A1 | 5/2014 | Nakajima et al. | |
| 2014/0253771 A1 | 9/2014 | Okita et al. | |
| 2014/0285627 A1 | 9/2014 | Kuboi | |
| 2014/0285707 A1 | 9/2014 | Ogawa | |
| 2014/0320735 A1 * | 10/2014 | Ikedo ...................... | H04N 5/378 |
| | | | 348/350 |
| 2014/0340555 A1 | 11/2014 | Iwane et al. | |
| 2014/0362277 A1 | 12/2014 | Kobuse | |
| 2014/0368696 A1 | 12/2014 | Uchida | |
| 2014/0375861 A1 * | 12/2014 | Jang ...................... | H04N 5/2353 |
| | | | 348/333.01 |
| 2015/0002715 A1 | 1/2015 | Ise | |
| 2015/0009383 A1 * | 1/2015 | Fujii ...................... | H04N 5/378 |
| | | | 348/302 |
| 2015/0062102 A1 | 3/2015 | Ikeda | |
| 2015/0062394 A1 * | 3/2015 | Ikeda ...................... | H04N 5/347 |
| | | | 348/301 |
| 2015/0062934 A1 | 3/2015 | Ekey | |
| 2015/0097258 A1 | 4/2015 | Shigetoshi | |
| 2015/0124129 A1 | 5/2015 | Aoki et al. | |
| 2015/0187844 A1 | 7/2015 | Lee et al. | |
| 2015/0189214 A1 | 7/2015 | Kurose | |
| 2015/0237276 A1 | 8/2015 | Hynecek | |
| 2015/0256778 A1 | 9/2015 | Kusaka | |
| 2015/0296158 A1 | 10/2015 | Mansoorian | |
| 2016/0037111 A1 | 2/2016 | Dai et al. | |

FOREIGN PATENT DOCUMENTS

| | | |
|---|---|---|
| JP | 2009124550 A | 6/2009 |
| JP | 2011-091535 A | 5/2011 |
| JP | 2013-106194 A | 5/2013 |
| JP | 2014-072541 A | 4/2014 |
| JP | 2014-179778 A | 9/2014 |
| JP | 2014-182237 A | 9/2014 |
| JP | 2014-183206 A | 9/2014 |
| JP | 2014178603 A | 9/2014 |
| JP | 2014182238 A | 9/2014 |
| JP | 2014-222863 A | 11/2014 |
| JP | 2014-239316 A | 12/2014 |
| WO | 2013183266 A | 12/2013 |
| WO | 2014/007004 A1 | 1/2014 |
| WO | 2014/050875 A1 | 4/2014 |

OTHER PUBLICATIONS

Cited in the Jan. 27, 2017 Japanese Office Action, with an English Translation, that issued in Japanese Patent Application No. 2015241409. Submitted in grandparent U.S. Appl. No. 16/059,182.

(56) References Cited

OTHER PUBLICATIONS

Cited in the Jan. 16, 2018 Korean Office Action, without an English Translation, that issued in Korean Patent Application No. 10-2015-0189192. Submitted in grandparent U.S. Appl. No. 16/059,182.
English translation of a Japanese Office Action dated Jul. 1, 2022, that issued in the corresponding Japanese Patent Application No. 2022-057089.
Cited in an Sep. 3, 2018 Chinese Office Action, with an English Translation, that issued in Chinese Patent Application No. 20160006005.4. Submitted in grandparent U.S. Appl. No. 16/059,182.
Cited in an Jul. 12, 2019 Japanese Office Action, without an English Translation, that issued in Japanese Patent Application No. 201800981. Submitted in grandparent U.S. Appl. No. 16/059,182.
Cited in a Sep. 18, 2019 European Office Action, that issued in European Patent Application No. 16 195 037.3. Submitted in grandparent U.S. Appl. No. 16/059,182.
The above foreign patent documents were cited in the Jul. 4, 2022 Japanese Office Action, without an English Translation, that issued in Japanese Patent Application No. 2021-126875.
Cited in a U.S Office Action dated Nov. 26, 2020 and dated Jun. 22, 2020 Notice of Allowance that issued in U.S. Appl. No. 16/991,129.
Cited in a Aug. 25, 2021 Chinese Office Action, with an English Translation, that issued in Chinese Application No. 201910511687.8. Submitted in parent U.S. Appl. No. 16/991,129.
The above foreign patent document was cited in the Jul. 1, 2022 Japanese Office Action, without an English Translation, that issued in Japanese Patent Application No. 2022-057089.

\* cited by examiner

☐ IMAGE CAPTURE REGION 701

▨ IMAGE CAPTURE AND FOCUS DETECTION REGION 702

IMAGE SENSOR AND IMAGE CAPTURING APPARATUS

CROSS-REFERENCE TO RELATED APPLICATIONS

This application is a continuation of application Ser. No. 16/991,129, filed Aug. 12, 2020, which is a continuation of application Ser. No. 16/059,182, filed Aug. 9, 2018, which issued as U.S. Pat. No. 10,785,438 on Sep. 22, 2020, which is a continuation of application Ser. No. 14/984,465, filed Dec. 30, 2015, which issued as U.S. Pat. No. 10,070,088 on Sep. 4, 2018, the entire disclosures of which are hereby incorporated by reference.

BACKGROUND OF THE INVENTION

Field of the Invention

The present invention relates to an image sensor and an image capturing apparatus.

Description of the Related Art

In recent years, image sensors used in image capturing apparatuses, such as digital still cameras and digital video cameras, are becoming increasingly multifunctional.

Japanese Patent Laid-Open No. 2013-106194 discloses a technique to enable focus detection of a pupil-division type in an image sensor. According to Japanese Patent Laid-Open No. 2013-106194, each pixel composing the image sensor has two photodiodes that are configured to receive beams of light that have passed through different pupils of an image capture lens with the aid of one microlens. In this way, focus detection can be performed on the image capture lens by comparing signals output from the two photodiodes with each other, and a signal of a captured image can be obtained from a combined signal derived from the two photodiodes.

Japanese Patent Laid-Open No. 2013-106194 also discloses the following method: after reading out a reset level signal and a signal of a first photodiode, a signal of a second photodiode is combined without resetting, the resultant combined signal is read out, and the signal of the second photodiode is obtained by subtracting the signal of the first photodiode from the resultant combined signal. With this method, the reset level signal can be used in common for the signals of the first and second photodiodes, and thus readout of the reset level signal can be reduced by one session.

Meanwhile, Japanese Patent Laid-Open No. 2014-72541 discloses a method of obtaining a signal of a captured image by reading out signals of first and second photodiodes in parallel, applying A/D conversion to the signals, and then digitally combining the signals.

In the case of an image sensor in which two photodiodes are provided per pixel, in order to obtain a signal for focus detection and a signal for a captured image, it is necessary to acquire individual signals of the two photodiodes, as well as a combined signal derived therefrom. An image capturing apparatus described in Japanese Patent Laid-Open No. 2013-106194 reads out a combined signal for a captured image after reading out a signal of a first photodiode for focus detection, and hence does not allow for simultaneous acquisition of a signal for focus detection and a signal for a captured image. This has the risk of significantly increasing a readout time period compared to a conventional image sensor in which one photodiode is provided per pixel. On the other hand, an image capturing apparatus described in Japanese Patent Laid-Open No. 2014-72541 can obtain a signal for a captured image only if it executes combining processing after reading out signals of first and second photodiodes for focus detection.

SUMMARY OF THE INVENTION

The present invention provides an image sensor that enables high-speed readout through parallel readout of an image capture signal and a focus detection signal.

According to one embodiment of the invention, the invention relates to an image sensor, comprising a pixel region in which a plurality of pixel units are arranged, each pixel unit having first and second photoelectric conversion portions, a first output portion that outputs, outside of the image sensor, a first signal based on a signal from the first photoelectric conversion portion of the pixel units, and a second output portion that outputs a second signal based on a signal from the first photoelectric conversion portion and a signal from the second photoelectric conversion portion of the pixel units, wherein output of the first signal from the first output portion and output of the second signal from the second output portion are performed in parallel.

Further features of the present invention will become apparent from the following description of embodiments (with reference to the attached drawings).

DESCRIPTION OF THE EMBODIMENTS

The following describes embodiments of the present invention in detail with reference to the drawings.

First Embodiment

First, a description is given of the principle of focus detection of a pupil-division type in an image capturing apparatus according to embodiments of the invention.

Figure 1:
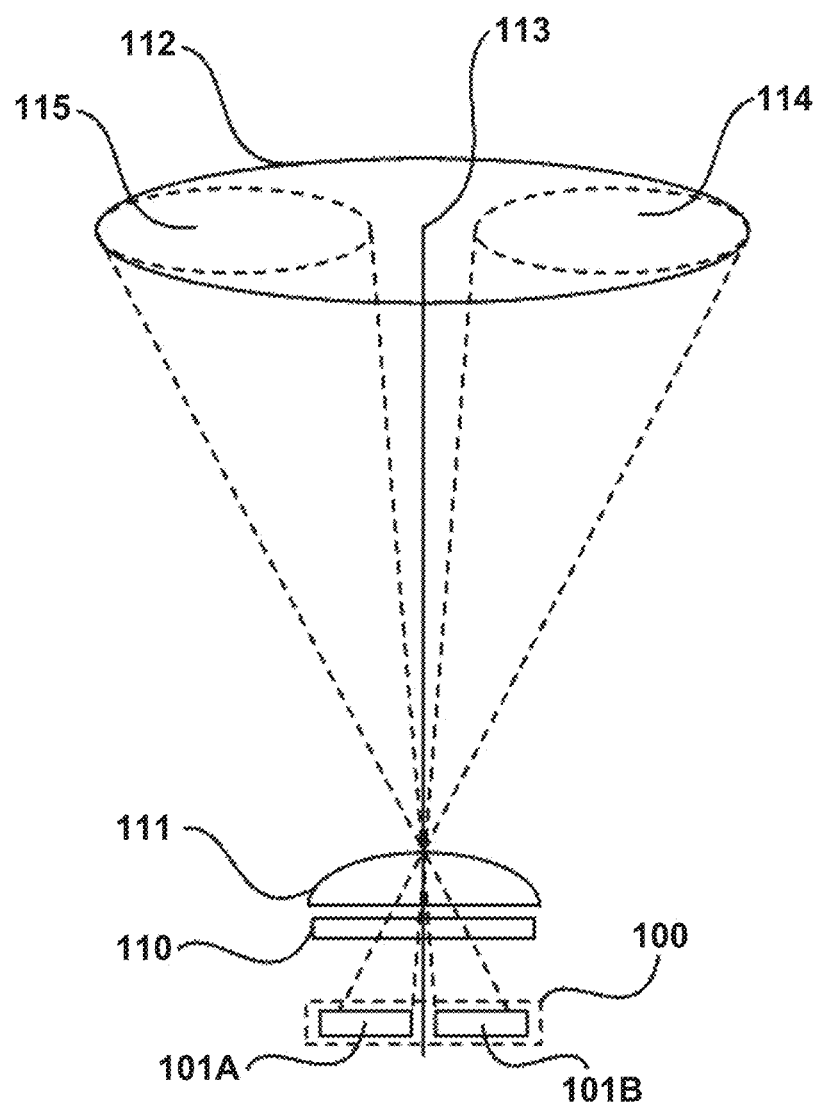
FIG. 1 illustrates the principle of focus detection of a pupil-division type in an image sensor according to embodiments of the invention.

FIG. 1 is a conceptual diagram showing how a beam of light that has exited an exit pupil of an image capture lens is incident on a pixel unit. A pixel unit 100 includes a first photodiode 101A and a second photodiode 101B. The pixel unit 100 is provided with a color filter 110 and a microlens 111.

The center of a beam of light that has exited from an exit pupil 112 toward the pixel provided with the microlens 111 is regarded as an optical axis 113. Light that has passed through the exit pupil 112 is incident on the pixel unit 100, with the optical axis 113 serving as the center. Some portions of the exit pupil 112 serve as pupil areas 114, 115. As shown in FIG. 1, a beam of light that passes through the pupil area 114 is received by the photodiode 101A via the microlens 111. On the other hand, a beam of light that passes through the pupil area 115 is received by the photodiode 101B via the microlens 111. As such, the photodiodes 101A and 101B receive light from different areas of the exit pupil 112. Thus, a phase difference can be detected by comparing signals output from the photodiodes 101A and 101B with each other.

Herein, a signal obtained from the photodiode 101A and a signal obtained from the photodiode 101B are defined as an A image signal and a B image signal, respectively. Also, a signal obtained by combining the A image signal and the B image signal is defined as an A+B image signal. This A+B image signal serves as an image capture signal, and can be used for a captured image. In an image sensor according to the embodiments of the invention, control is performed in such a manner that the A image signal, the B image signal, and the A+B image signal are read out from the pixel unit in parallel.

Figure 2:
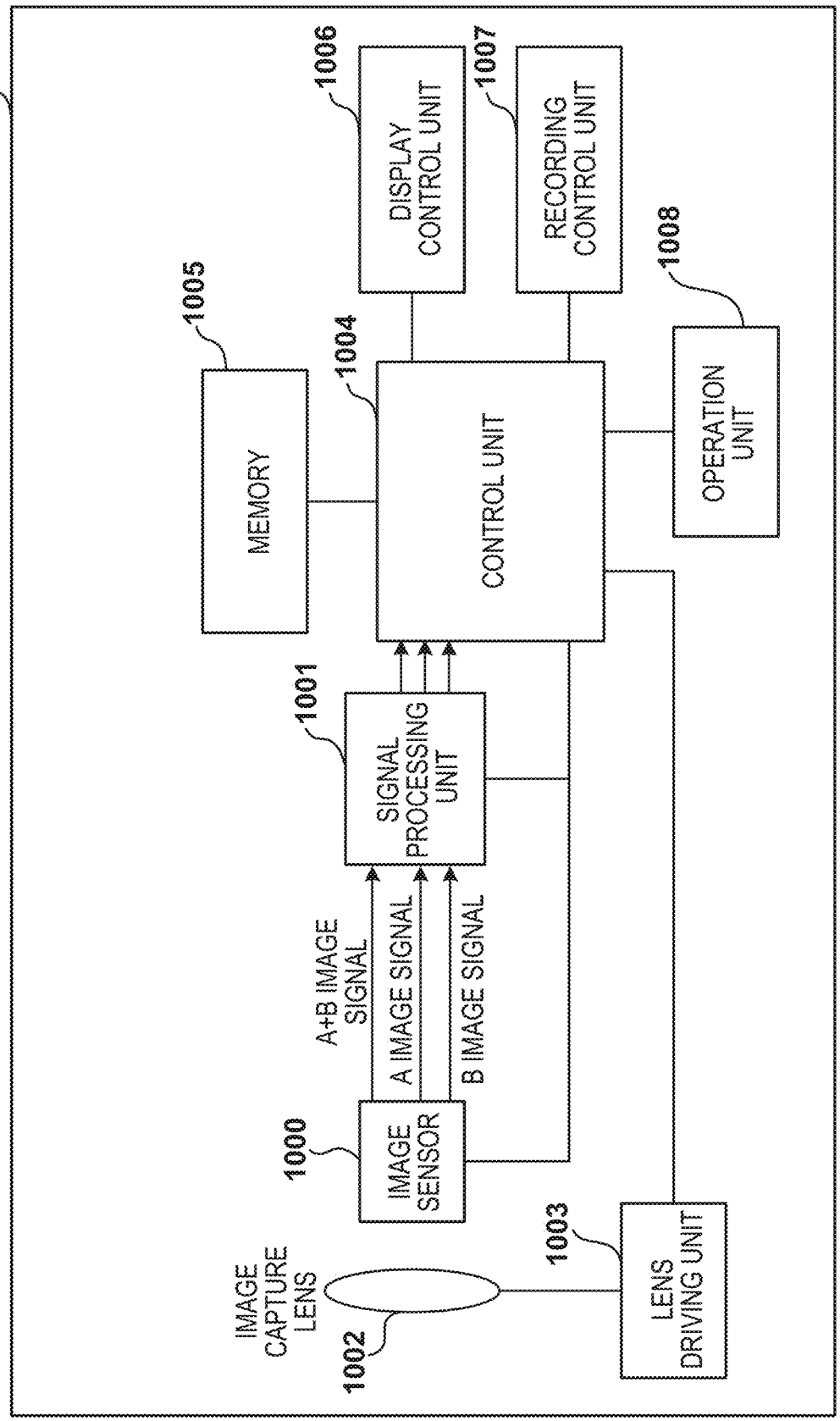
FIG. 2 is a block diagram showing an example of an overall configuration of an image capturing apparatus according to the embodiments of the invention.

A description is now given of an example of a configuration of the image capturing apparatus 10 according to the embodiments of the invention with reference to FIG. 2. In the image capturing apparatus 10 shown in FIG. 2, each block may be configured in the form of hardware using a dedicated logic circuit and a memory, except for a physical device, such as an image sensor. Alternatively, each block may be configured in the form of software realized by a computer, such as a CPU, executing a processing program stored in a memory.

An image capture lens 1002 forms an optical image of a subject on an image sensor 1000, and a lens driving unit 1003 performs zoom control, focus control, diaphragm control, and the like. The image sensor 1000 includes a plurality of pixel units arranged in a matrix, and imports a subject image formed by the image capture lens as a signal. The image sensor 1000 outputs A+B image signals, A image signals, and B image signals. A signal processing unit 1001 applies various types of signal processing to the A+B image signals, A image signals, and B image signals output from the image sensor 1000. A control unit 1004 carries out various types of computation, executes control processing for controlling the entire image capturing apparatus 10, and performs a focus detection operation using the A image signals and B image signals. A memory 1005 temporarily stores image data, and a display control unit 1006 performs display control for displaying various types of information and captured images on a display apparatus. A recording control unit 1007 performs control involving, for example, recording or readout of image data with respect to an attachable/removable recording medium, such as a semiconductor memory. An operation unit 1008 is composed of a button, a dial, and the like, and accepts operational input from a user. Note that in a case where the display apparatus is a touchscreen, this touchscreen is also included in the operation unit 1008.

Figure 3:
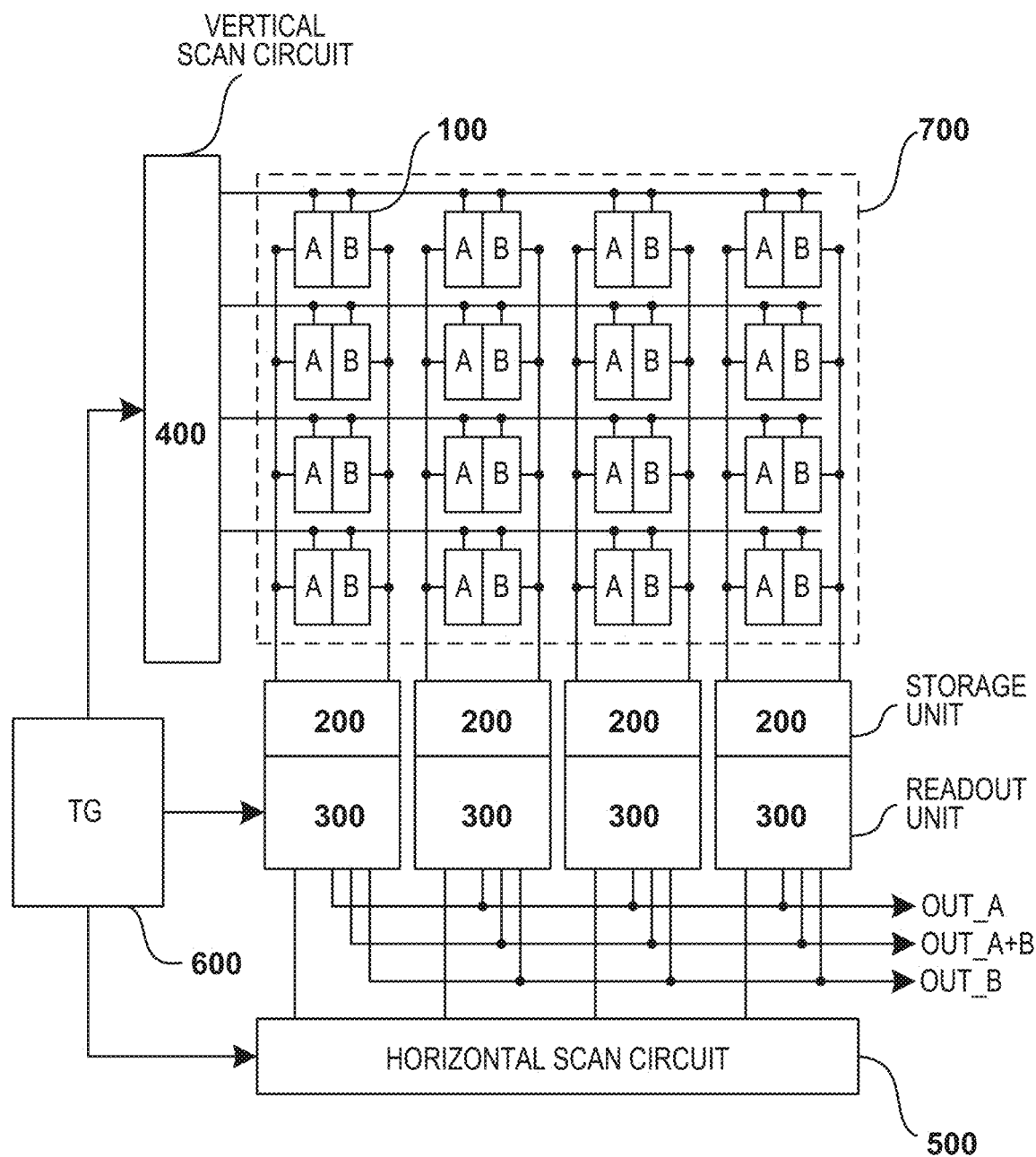
FIG. 3 is a circuit diagram showing an example of an overall configuration of an image sensor according to a first embodiment of the invention.
Figure 4:
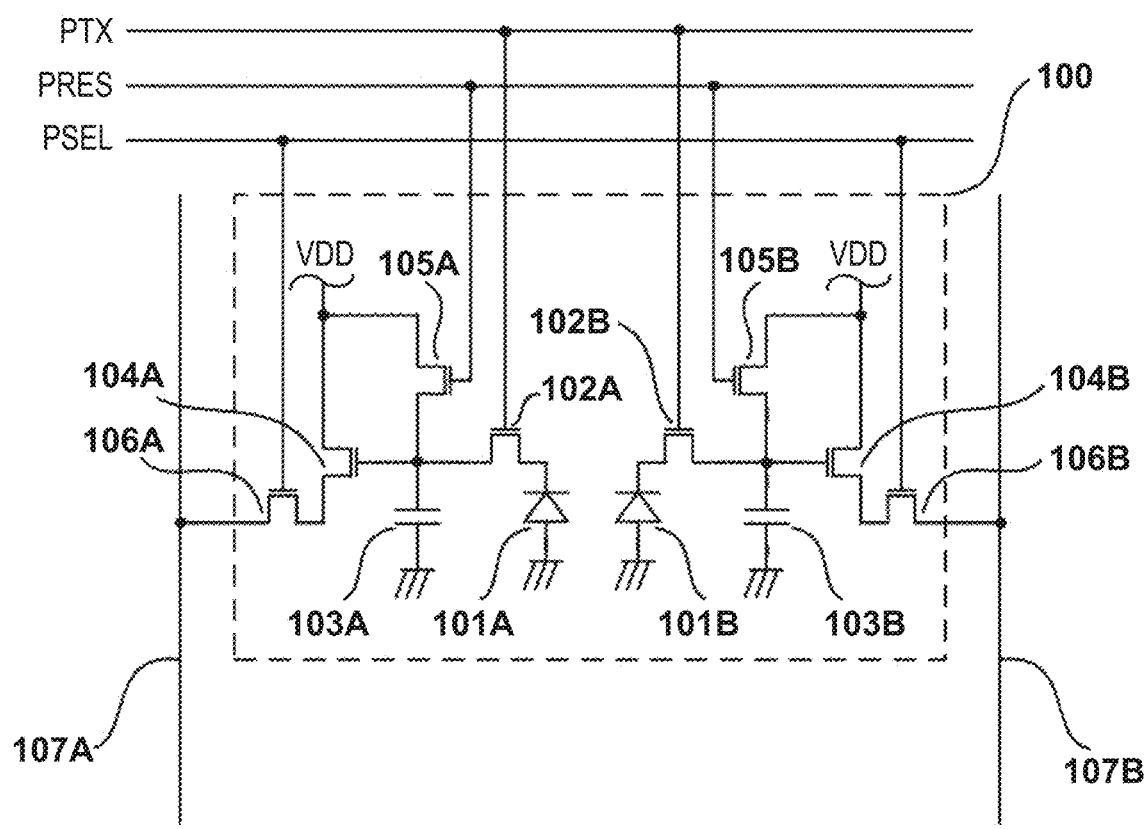
FIG. 4 shows an example of a circuit configuration of pixel units in the image sensor according to the first embodiment of the invention.

A description is now given of an example of a configuration of an image sensor 1000 according to an embodiment of the invention with reference to FIGS. 3 to 5. FIG. 3 schematically shows an overall configuration of the image sensor 1000. The image sensor 1000 is composed of a pixel region 700, storage units 200, readout units 300, a vertical scan circuit 400, a horizontal scan circuit 500, and a timing generation circuit (TG) 600. Pixel units 100 that each have two photodiodes are arrayed in the pixel region 700. Although the present embodiment exemplarily illustrates 4×4 pixel arrangement for ease of explanation, a larger number of pixels are arranged in practice. Note that a pixel unit 100 at the upper left corner of the pixel region 700 is defined as a pixel in the first row and the first column throughout the present specification, unless specifically stated otherwise. The vertical scan circuit 400 selects pixels in the pixel region 700 on a row-by-row basis, and transmits a driving signal to the pixels in the selected row.

The storage units 200 are provided in one-to-one correspondence with pixel columns, and store signals that have been read out from the pixel units 100 on a row-by-row basis. The readout units 300 are provided in one-to-one correspondence with the pixel columns, apply A/D conversion to the signals stored in the storage units 200, and output the resultant signals to the outside of the image sensor based on control signals from the horizontal scan circuit 500. The readout units 300 output A+B image signals, A image signals, and B image signals. The timing generation circuit (TG) 600 transmits timing signals for controlling the readout units 300, the vertical scan circuit 400, and the horizontal scan circuit 500.

FIG. 4 is a circuit diagram showing an example of a circuit configuration of the pixel unit 100 in the image sensor 1000 according to the embodiment of the invention. Each pixel unit 100 is composed of, for example, a first photodiode 101A, a second photodiode 101B, transfer switches 102A, 102B, floating diffusions 103A, 103B, amplifier portions 104A, 104B, reset switches 105A, 105B, and selection switches 106A, 106B.

The photodiodes 101A, 101B function as photoelectric conversion portions that receive light that has passed through the same microlens, and generate charges corresponding to the amounts of received light. The transfer switches 102A, 102B transfer the charges generated by the photodiodes 101A, 101B to the floating diffusions 103A, 103B, respectively. The transfer switches 102A, 102B are controlled by a transfer pulse signal PTX. The floating diffusions 103A, 103B function as charge-voltage conversion portions that temporarily store the charges transferred from the photodiodes 101A, 101B, respectively, and convert the stored charges into voltage signals. The amplifier portions 104A, 104B are amplification transistors that amplify the voltage signals based on the charges stored in the floating diffusions 103A, 103B, respectively, and output the amplified voltage signals as pixel signals. The amplification transistors, together with non-illustrated electric current source transistors connected to column output lines 107A, 107B, constitute source followers.

The reset switches 105A, 105B are controlled by a reset pulse signal PRES, and reset the potentials of the floating diffusions 103A, 103B to a reference potential VDD. The selection switches 106A, 106B are controlled by a vertical selection pulse signal PSEL, and output the pixel signals amplified by the amplifier portions 104A, 104B to the column output lines 107A, 107B, respectively.

Figure 5A:
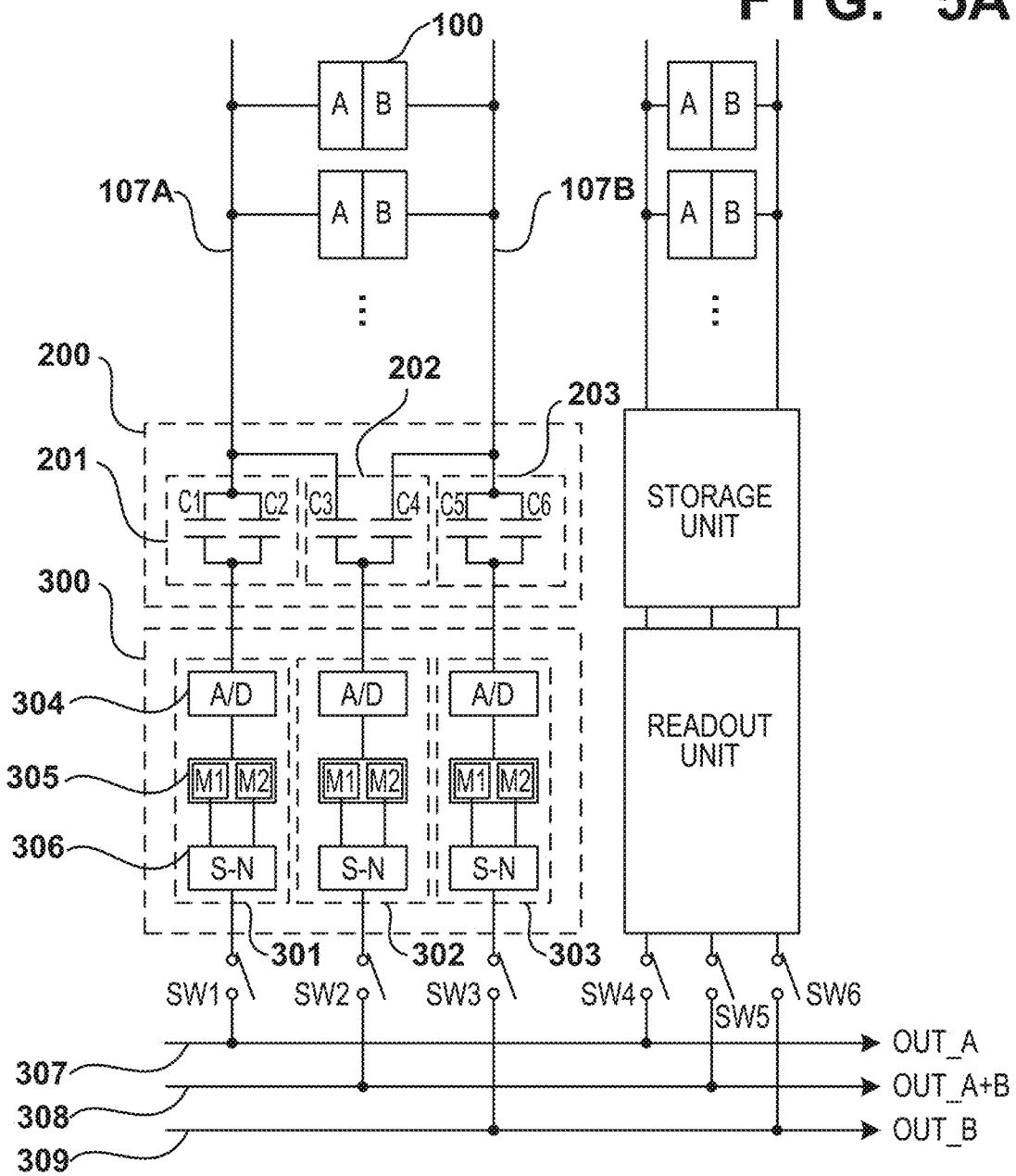
FIGS. 5A and 5B show examples of configurations of storage units and readout units in the image sensor according to the first embodiment of the invention.

FIG. 5A shows examples of configurations of the storage units 200 and the readout units 300 according to the embodiment of the invention; for the sake of simplicity, only configurations corresponding to two columns are illustrated therein. The storage units 200 are configured in the same way for all columns, and so are the readout units 300. Each storage unit 200 includes three storage circuits 201, 202, 203. The storage circuit 201 is composed of capacitors C1, C2 that are connected in parallel; each of the capacitors C1, C2 is connected to the column output line 107A at one end, and connected to a readout circuit 301 within the corresponding readout unit 300 at the other end. The storage circuit 201 stores an A image signal from the corresponding photodiode 101A.

The storage circuit 203 is composed of capacitors C5, C6 that are connected in parallel; each of the capacitors C5, C6 is connected to the column output line 107B at one end, and connected to a readout circuit 303 within the corresponding readout unit 300 at the other end. The storage circuit 203 stores a B image signal from the corresponding photodiode 101B.

The storage circuit 202 is composed of two capacitors C3, C4; one capacitor, C3, is connected to the column output line 107A at one end, whereas the other capacitor, C4, is connected to the column output line 107B at one end. The capacitors C3, C4 are connected in common to a readout circuit 302 within the corresponding readout unit 300 at the other ends. The storage circuit 202 stores an A+B image signal from both of the photodiodes 101A, 101B in the corresponding pixel unit 100. Note that the capacitors C1 to C6 have the same capacitance value.

Figure 5B:
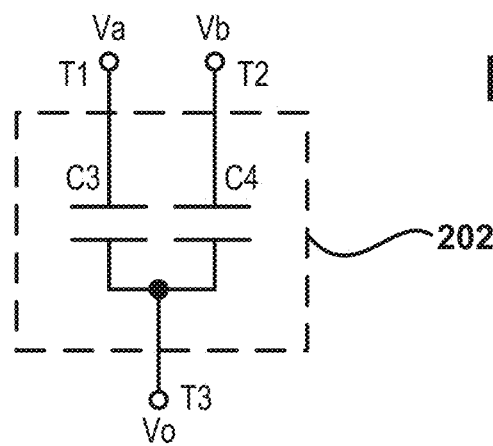

The following describes how the storage circuit 202 obtains the A+B image signal with reference to FIG. 5B. Provided that input terminals T1, T2 have voltages of Va, Vb and an output terminal T3 has a voltage of Vo when the storage circuit 202 is in an initial state (reset state), charges Qa, Qb accumulated in the capacitors C3, C4 are given by Expressions 1, 2. It will be assumed that a capacitance value of the capacitor C3 and a capacitance value of the capacitor C4 are Ca and Cb, respectively.

$$Qa=Ca(Va-Vo) \quad \text{Expression 1}$$

$$Qb=Cb(Vb-Vo) \quad \text{Expression 2}$$

Now, assume that the voltages of the input terminals T1, T2 have changed to Va+ΔVa, Vb+ΔVb, respectively, and the voltage of the output terminal T3 has changed to Vo+ΔVo, after signals have been read out from the photodiodes 101A and 101B. In this case, charges Qa', Qb' accumulated in the capacitors C3, C4 are given by Expressions 3, 4.

$$Qa'=Ca\{(Va+\Delta Va)-(Vo+\Delta Vo)\} \quad \text{Expression 3}$$

$$Qb'=Cb\{(Vb+\Delta Vb)-(Vo+\Delta Vo)\} \quad \text{Expression 4}$$

Under the law of charge conservation, the relationship Qa+Qb=Qa'+Qb' holds, and hence Expression 5 can be derived from Expressions 1 to 4.

$$\Delta Vo=(Ca\Delta Va+Cb\Delta Vb)/(Ca+Cb) \quad \text{Expression 5}$$

In a case where the capacitors C3, C4 have the same capacitance value (Ca=Cb), a change in the voltage of the output terminal T3, ΔVo, is given by Expression 6.

$$\Delta Vo=(\Delta Va+\Delta Vb)/2 \quad \text{Expression 6}$$

This is an average signal of the photodiodes 101A and 101B. A product of this signal and a doubling gain can be used as the A+B image signal. Therefore, the signal stored in the storage circuit 202 is referred to as the A+B image signal. It is sufficient to multiply the signal by the doubling gain in, for example, the signal processing unit 1001 or the control unit 1004.

Returning to the description of FIG. 5A, each readout unit 300 is composed of readout circuits 301, 302, 303. Specific configurations of the readout circuits are the same. The A image signal, A+B image signal, B image signal stored in the storage circuits 201, 202, 203 are input to the readout circuits 301, 302, 303, respectively. Each of the readout circuits 301, 302, 303 includes an A/D conversion circuit 304, a memory 305, and an S-N circuit 306.

The A/D conversion circuit 304 converts the analog signal stored in the storage circuit 201, 202, or 203 to a digital signal. The A/D conversion circuit 304 is composed of, for example, a non-illustrated comparison circuit and a non-illustrated counter circuit. The comparison circuit compares a ramp signal whose voltage value changes depending on time with the input signal stored in the storage circuit 201, 202, or 203, and when the magnitude relationship between the signals is inversed, transmits a signal to the counter circuit. Upon accepting the signal from the comparison circuit, the counter circuit stores a counted value. This counted value is imported and stored to the memory 305 as a digital signal.

The memory 305 has two memory portions for storing digital signals. A memory portion M1 stores a later-described N signal serving as a reset signal, whereas a memory portion M2 stores a later-described S signal serving as a light signal. The S-N circuit 306 imports the digital N signal and S signal stored in the memory portions M1 and M2, and stores a digital signal obtained by subtracting the N signal from the S signal. The digital signals stored in the S-N circuits 306 of the readout circuits 301, 302, 303 are output to digital signal lines 307, 308, 309 via switches SW1, SW2, SW3, respectively. Note that in FIG. 5A, amplifiers may be provided at a stage preceding the A/D conversion circuits 304 so as to first amplify the analog signals stored in the storage circuits and then apply A/D conversion to the analog signals.

Figure 6:
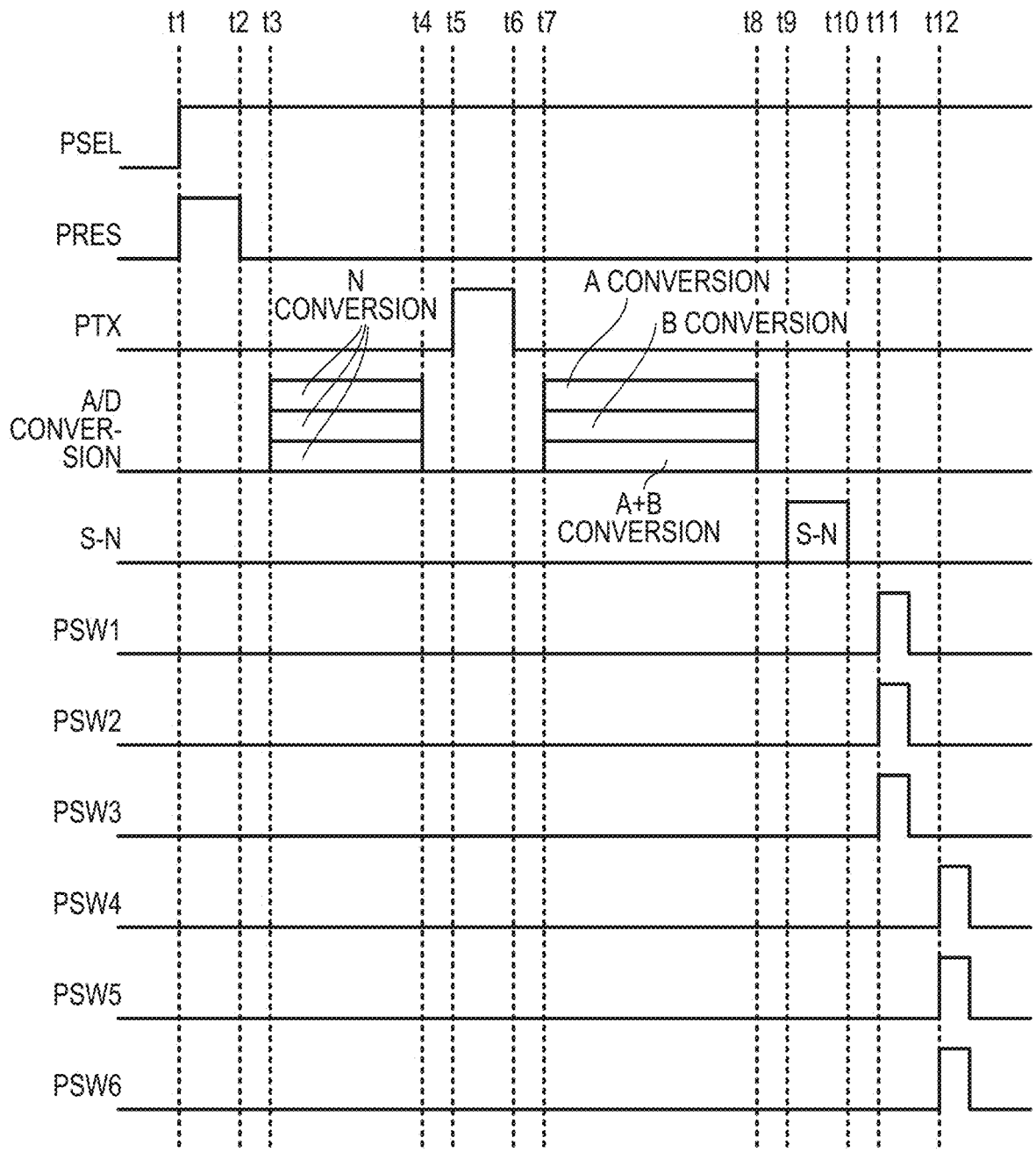
FIG. 6 is a timing chart showing an example of a driving method for the image sensor according to the first embodiment of the invention.

FIG. 6 is a driving timing chart for the image capturing apparatus 10 according to the embodiment of the invention. This figure shows timings of driving that is performed at the time of readout upon selection of a certain row by the vertical scan circuit. Referring to this figure, the switches SW1 to SW6 in FIG. 5A are in an on state when control signals PSW1 to PSW6 for the switches SW1 to SW6 are at an H level, respectively. Note that the control signals PSW1 to PSW6 are supplied from the horizontal scan circuit 500.

At time t1, the vertical selection pulse signal PSEL for the selected row is set to H, the selection switches 106A, 106B of the pixel units 100 in the selected row are turned on, and the pixel units 100 in the selected row are connected to the column output lines 107A, 107B. At this time t1, the reset pulse signal PRES is set to H, and in the pixel units 100, the reset switches 105A, 105B are turned on and the floating diffusions 103A, 103B are at a reset level. Therefore, pixel signals corresponding to the reset level of the floating diffusions are output to the column output lines 107A, 107B.

At time t2, the reset pulse signal PRES is set to L, and thus the reset switches 105A, 105B are turned off. At this moment, a potential at the time of cancellation of reset of the floating diffusions 103A is stored in the storage circuits 201. A potential at the time of cancellation of reset of the floating diffusions 103B is stored in the storage circuits 203. An average potential at the time of cancellation of reset of both floating diffusions 103A, 103B is stored in the storage circuits 202. Pixel signals that are stored in the storage circuits at this time t2 are reset level signals, and they are referred to as N signals.

From time t3 to time t4, the A/D conversion circuits 304 of the readout circuits 301, 302, 303 convert the N signals stored in the storage circuits 201, 202, 203 into digital signals. The converted digital signals are stored to M1 of the memories 305. An operation of converting the N signals into the digital signals from time t3 to time t4 is referred to as N conversion. The N signals stored in the storage circuits 201, 202, 203 undergo the N conversion in parallel.

Thereafter, at time t5, the transfer pulse signal PTX is set to H. Consequently, the transfer switches 102A, 102B of the pixels are turned on, charges generated through photoelectric conversion in the photodiodes 101A are transferred to the floating diffusions 103A, and charges generated through photoelectric conversion in the photodiodes 101B are transferred to the floating diffusions 103B. The A image signals corresponding to the amounts of charges generated by the photodiodes 101A are output to the column output lines 107A, whereas the B image signals corresponding to the amounts of charges generated by the photodiodes 101B are output to the column output lines 107B. At time t6, the transfer pulse signal PTX is set to L, and thus the transfer switches 102A, 102B are turned off. At this moment, the A image signals are stored in the storage circuits 201, and the B image signals are stored in the storage circuits 203. The A+B image signals are stored in the storage circuits 202, as stated earlier with reference to FIG. 5B.

From time t7 to time t8, the A/D conversion circuits 304 of the readout circuits convert the A image signals stored in the storage circuits 201, the B image signals stored in the storage circuits 203, and the A+B image signals stored in the storage circuits 202 into digital signals. The converted digital signals are stored to M2 of the memories 305 of the readout circuits. These operations performed from time t7 to t8, i.e., an operation of converting the A image signals into the digital signals, an operation of converting the B image signals into the digital signals, and an operation of converting the A+B image signals into the digital signals are referred to as A conversion, B conversion, and A+B conversion, respectively. The A conversion, B conversion, and A+B conversion are performed in parallel.

Thereafter, from time t9 to time t10, the S-N circuits 306 of the readout circuits import the N signals stored in M1 of the memories 305, as well as the light signals (S signals) stored in M2 of the same, i.e., the A image signals, B image signals, and A+B image signals. Then, the corresponding N signal is subtracted from each of the A image signals, B image signals, and A+B image signals, and the resultant signals are stored. This processing is referred to as noise removal processing (S-N processing). Through the S-N processing, fixed pattern noise and offset components can be removed from pixel signals.

At time t11, the control signals PSW1 to PSW3 are set to H, and thus the switches SW1 to SW3 are turned on. Consequently, the S-N circuits 306 of the readout unit 300 in the first column are connected to the digital signal lines 307, 308, 309. Then, the A image signal, A+B image signal, and B image signal stored in the S-N circuits are output to the outside of the image sensor 1000 via the digital signal lines 307, 308, 309.

Thereafter, at time t12, the control signals PSW4 to PSW6 are set to H, and thus the switches SW4 to SW6 are turned on. Then, the A image signal, A+B image signal, and B image signal stored in the S-N circuits in the second column are output to the outside of the image sensor via the digital signal lines 307, 308, 309. From then on, the foregoing horizontal scanning is repeated until the last column; as a result, output of the A image signals, A+B image signals, and B image signals in the selected row is completed.

The foregoing readout operation is repeated until the last row of the pixel region. Through this readout operation, the A image signal, A+B image signal, and B image signal are output in parallel from the digital signal lines 307, 308, 309, respectively. Under control by the control unit 1004, the focus detection operation using the output A image signals and B image signals can be performed in parallel with the generation of a captured image using the A+B image signals. As a result, the focus detection operation and the generation of the captured image can be performed at a high frame rate.

Note that the S-N processing of the S-N circuits 306 shown in FIG. 5A may be executed by the signal processing unit 1001 outside the image sensor 1000. In this case, it is sufficient to perform control so that the A image signal, B image signal, A+B image signal, and corresponding N signals are output from the digital signal lines. Furthermore, A/D conversion processing executed by the A/D conversion circuits 304 may also be executed by the signal processing unit outside the image sensor 1000. Although the present embodiment adopts a configuration in which both of the A image signal and B image signal are output from the image sensor, it may instead adopt a configuration in which only one of the A image signal and B image signal is output. In this case, it is sufficient to generate the image signal that has not been output by subtracting the output image signal from the A+B image signal in a signal processing circuit or the like. In this case also, the A+B image signal can be output in parallel with one of the A image signal and B image signal, and thus the captured image can be generated at a high frame rate.

As stated earlier, the A image signals and B image signals are necessary for the execution of focus detection processing. However, outputting the A image signals and B image signals of all pixel units 100 in the pixel region 700 from the readout units 300 to the outside of the image sensor 1000 may result in an enormous amount of signal transmission.

In some cases, correlation computation for focus detection is carried out after converting color signals into luminance signals. In view of this, the readout units 300 may execute computation processing for converting the A image signals and B image signals of each color into luminance signals before they are output from the image sensor 1000; in this way, the amount of signal transmission can be reduced to one-fourth.

For example, luminance signals YA, YB are generated by calculating luminance values through application of Bayer merging to the A image signals and B image signals. As signals corresponding to a Bayer pattern are necessary in computation of luminance values, pixel signals that have been read out by the readout units 300 are stored in the memories until all of the signals necessary for the computation are obtained. That is to say, as signals in a row corresponding to G and B are read out after signals in a row corresponding to R and G are read out, the A image signals and B image signals in the row corresponding to R and G are first stored to the memories, and once the signals in the row corresponding to G and B have been read out, luminance signals YA, YB are sequentially computed and output via the signal lines.

As described above, the readout units 300 of the image sensor 1000 execute signal processing for outputting the A image signals and B image signals to the outside of the image sensor after the A image signals and the B image signals have been converted into luminance signals. In this way, the amount of signal transmission can be reduced, and both captured image data and focus detection information can be output at high speed.

Second Embodiment

In the above first embodiment, control is performed so that A image signals, B image signals, and A+B image signals are output across the entire pixel region; alternatively, control may be performed so that A image signals and B image signals are output only in a region where a focus detection operation is performed. In view of this, the present second embodiment describes a control method for outputting A+B image signals across the entire pixel region, and outputting A image signals and B image signals only from pixel units belonging to a part of the pixel region in accordance with the positions of pixel units that are intended to output signals in the pixel region. In this case, with regard to a region where A image signals and B image signals are not read out, consumption of electric power can be reduced by stopping the supply of an electric power source to readout circuits 301 for A images and readout circuits 303 for B images shown in FIG. 5A.

Figure 7A:
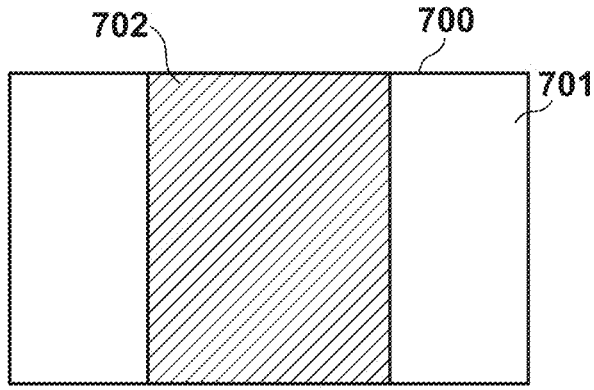
FIGS. 7A to 7E illustrate regions for performing image capture and a focus detection operation in an image sensor according to a second embodiment of the invention.
Figure 7B:
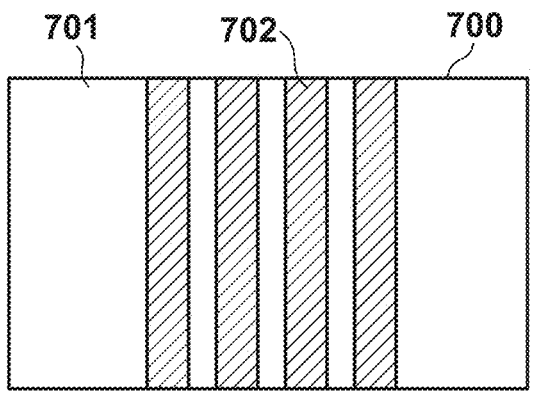

FIGS. 7A to 7E illustrate regions for performing image capture and a focus detection operation in the second embodiment. In FIG. 7A, only A+B image signals are output in an image capture region 701, whereas A+B image signals, A image signals, and B image signals are output in an image capture and focus detection region 702. Note that FIG. 7A depicts a case in which the image capture and focus detection region 702 is set as a single rectangular region; alternatively, as shown in FIG. 7B, image capture and focus detection regions 702 may be set at a constant interval, with each region corresponding to a predetermined number of columns.

Figure 8A:
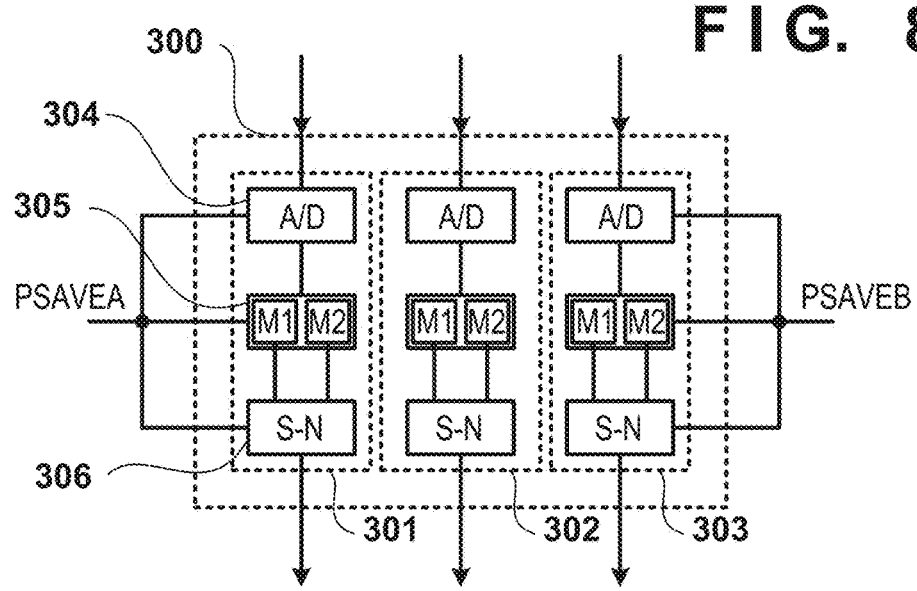
FIG. 8A shows an example of a configuration of readout units in the image sensor.

FIG. 8A shows an example of a configuration of readout units according to the second embodiment. This figure corresponds to the readout units 300 according to the first embodiment shown in FIG. 5A. A detailed description of portions that are identical to those of the readout units shown in FIG. 5A is omitted. In FIG. 8A, a PSAVEA signal is a control signal for saving power of readout circuits 301 for A images. A PSAVEB signal is a control signal for saving power of readout circuits 303 for B images. Setting the PSAVEA signal and the PSAVEB signal to H blocks the supply of power source voltage or electric current to A/D conversion circuits 304, memories 305, and S-N circuits 306 of the corresponding readout circuits 301, 303, thereby realizing a power saving state. Control is performed so that the PSAVEA signal and PSAVEB signal are turned on/off on a column-by-column basis.

Figure 8B:
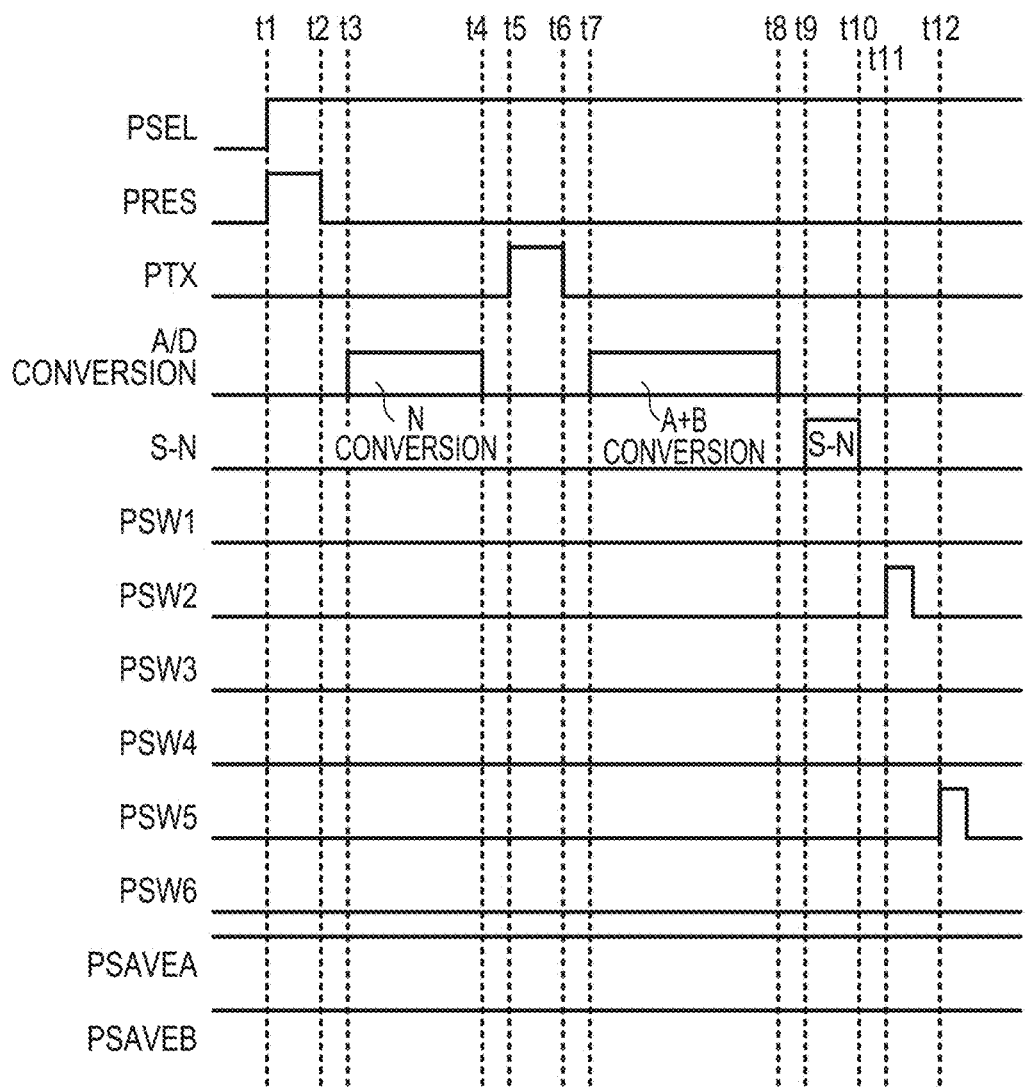
FIG. 8B is a timing chart showing an example of a driving method for the image sensor, according to the second embodiment of the invention.
Figure 9:
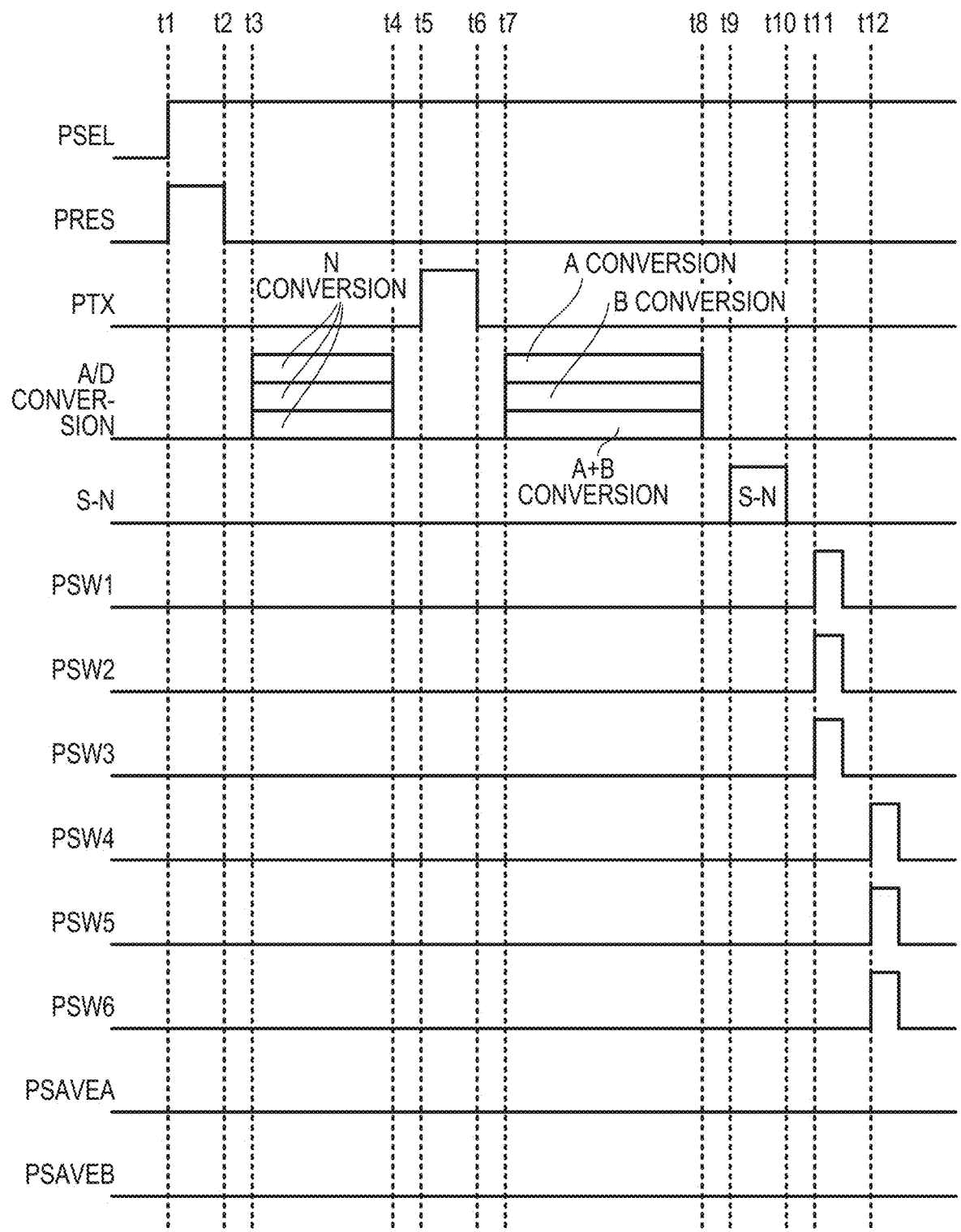
FIG. 9 is a timing chart showing another example of the driving method for the image sensor according to the second embodiment of the invention.

FIGS. 8B and 9 are examples of a driving timing chart according to the second embodiment. FIG. 8B is a driving timing chart for the image capture region, whereas FIG. 9 is a driving timing chart for the image capture and focus detection region. FIGS. 8B and 9 correspond to FIG. 6 of the first embodiment, and a description of portions that are identical, in terms of operations, to those according to the first embodiment is omitted.

As shown in FIG. 8B, with regard to the image capture region, control is performed so that the PSAVEA signal and PSAVEB signal are set to H. In this way, the readout circuits 301 for A images and the readout circuits 303 for B images are placed in the power saving state, and thus N conversion, A conversion, B conversion, and S-N processing are not performed in these readout circuits. Furthermore, with regard to the image capture region, during horizontal scanning from time t11, control signals PSW1, PSW3, PSW4, PSW6 are always at an L level, and thus A image signals and B image signals are not output to digital signal lines. On the other hand, with regard to the image capture and focus detection region, control is performed so that the PSAVEA signal and PSAVEB signal are set to L as shown in FIG. 9. In this case, operations that are identical to the operation of the first embodiment are performed; that is to say, A+B image signals, A image signals, and B image signals are output to the digital signal lines.

By performing control in the above-described manner, A image signals and B image signals can be output only in a region where focus detection is performed. In a region where A image signals and B image signals are not read out, consumption of electric power can be reduced by turning off the electric power source for the readout circuits 301 for A images and the readout circuits 303 for B images. Furthermore, in the present embodiment also, the generation of a captured image and the focus detection operation can be performed in parallel as the A+B image signal, A image signal, and B image signal are output in parallel. As a result, the generation of the captured image and the focus detection operation can be performed at a high frame rate.

Figure 7C:
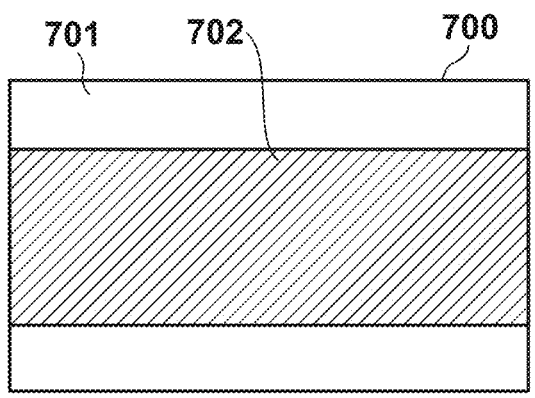
Figure 7D:
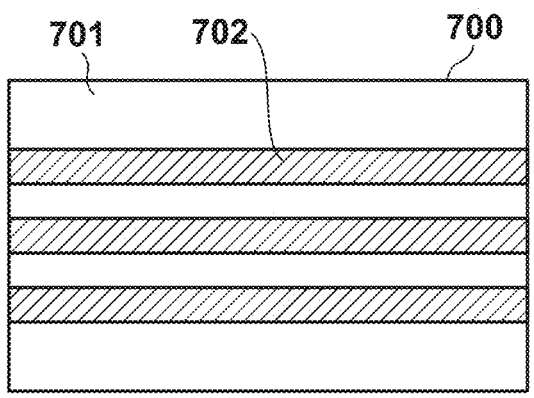
Figure 7E:
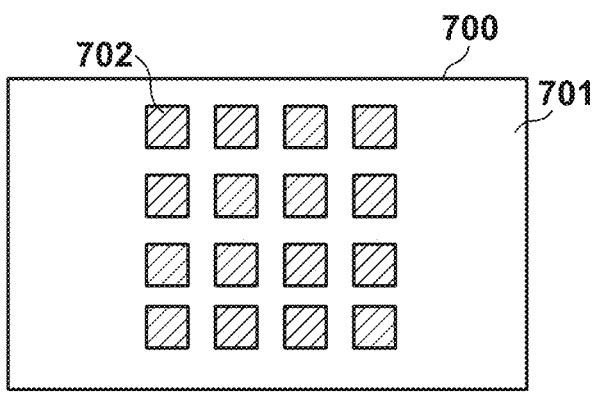

In the present second embodiment, the image capture region 701 and the image capture and focus detection region(s) 702 are set on the basis of columns as shown in FIGS. 7A and 7B; alternatively, in modification examples of the second embodiment, the image capture region 701 and the image capture and focus detection region(s) 702 may be set on the basis of rows as shown in FIGS. 7C and 7D. FIG. 7C depicts a case in which an image capture and focus detection region 702 is set as a single rectangular region, whereas FIG. 7D depicts a case in which image capture and focus detection regions 702 are set at a constant interval, with each region corresponding to a predetermined number of rows. Furthermore, as shown in FIG. 7E, image capture and focus detection regions 702 may be set as small rectangular regions that are discretely arranged. In these cases also, it is sufficient to perform driving as shown in FIG. 8B for the image capture region, and perform driving as shown in FIG. 9 for the image capture and focus detection region(s), similarly to the second embodiment. In this way, only A+B image signals can be output in the image capture region, and A+B image signals, A image signals, and B image signals can be output in the image capture and focus detection region(s).

Third Embodiment

With the configurations described in the above first and second embodiments, it is necessary to provide the readout units in one-to-one correspondence with the columns, with each readout unit including three readout circuits; this has the risk of increasing the circuit scale of the image sensor 1000. In view of this, a third embodiment describes a configuration in which an increase in the circuit scale is suppressed due to sharing of a storage unit and a readout unit among a plurality of columns.

In the present embodiment, a readout unit is shared among three columns that are located at a one-column interval, and the following modes are used: a focus detection readout mode for outputting an A+B image signal, an A image signal, and a B image signal obtained by averaging signals of three pixels in the horizontal direction, and a normal readout mode for outputting only A+B image signals without averaging signals of three pixels in the horizontal direction.

Figure 10:
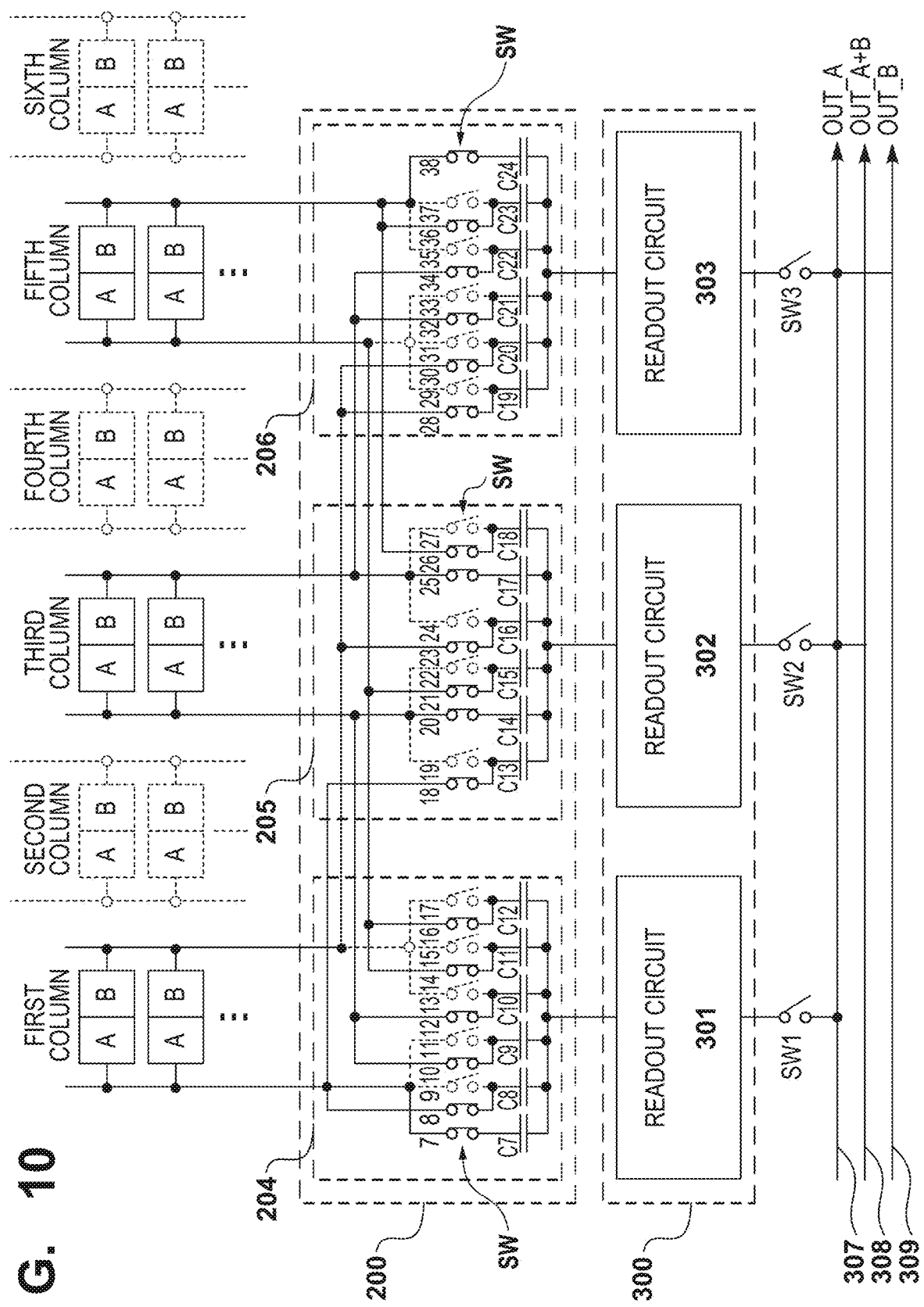
FIG. 10 shows examples of configurations of storage units and readout units for a focus detection readout mode according to a third embodiment of the invention.
Figure 11:
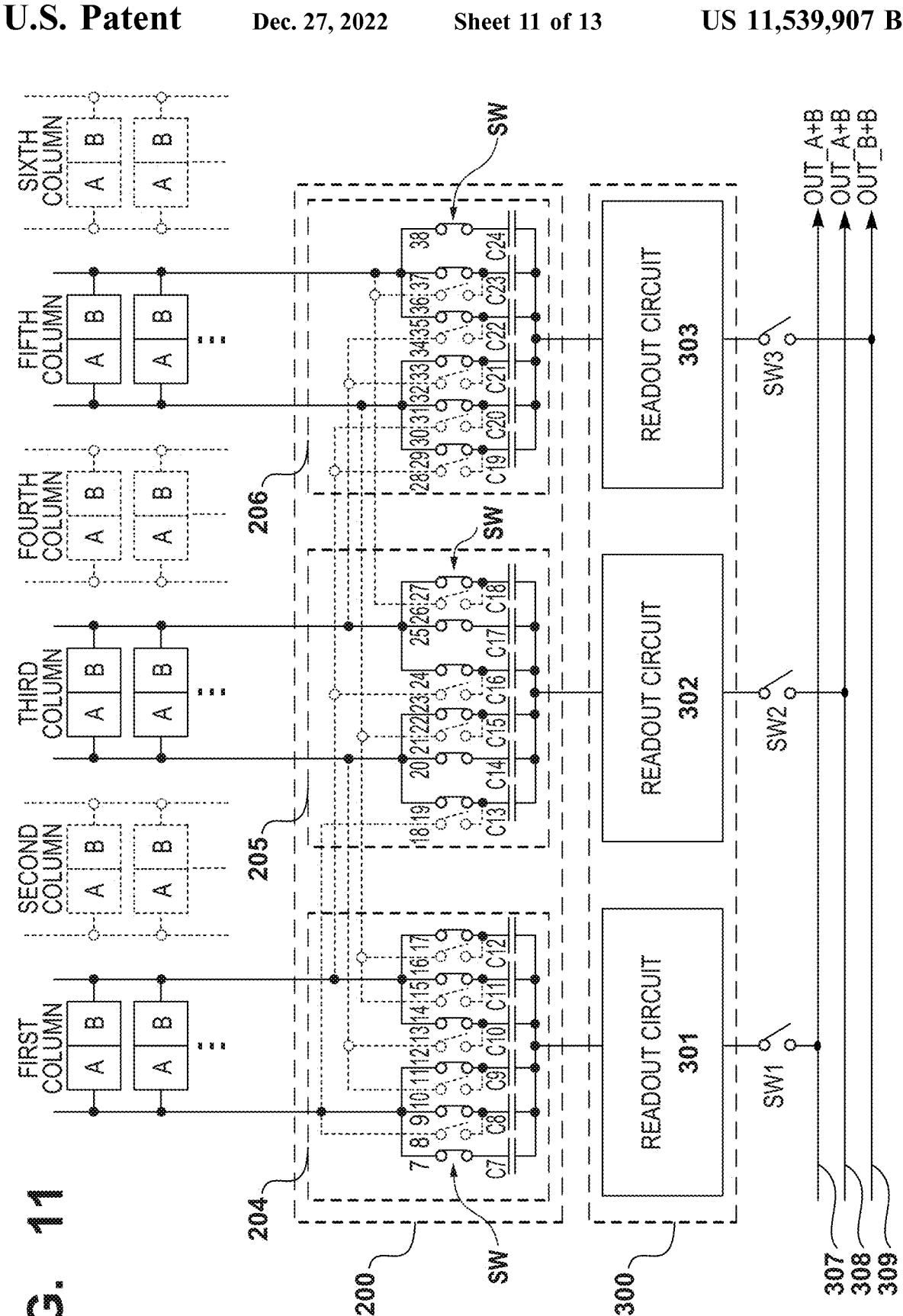
FIG. 11 shows examples of configurations of the storage units and the readout units for a normal readout mode according to the third embodiment of the invention.

FIGS. 10 and 11 show examples of configurations of storage units 200 and readout units 300 according to the present embodiment. In the figures, only the first to sixth columns are shown for the sake of simplicity. FIG. 10 shows configurations for the focus detection readout mode, whereas FIG. 11 shows configurations for the normal readout mode. Switching between the focus detection readout mode and the normal readout mode is enabled by turning on/off switches SW7 to SW38.

In the present embodiment, it will be assumed that a pair of a storage unit 200 and a readout unit 300 is provided per set of three pixel columns, and as shown in FIGS. 10 and 11, pixels in the first, third, and fifth columns are connected to a common storage unit 200. Readout for pixels in the second, fourth, and sixth columns is performed in a direction opposite to a direction of readout for the pixels in the first, third, and fifth columns relative to a pixel region, and the pixels in the second, fourth, and sixth columns are connected to a common storage unit. That is to say, pixels belonging to a set of three consecutive odd-numbered columns share a storage unit 200 and a readout unit 300 provided below an image sensor 1000, whereas pixels belonging to a set of three consecutive even-numbered columns share a storage unit 200 and a readout unit 300 provided above the image sensor 1000. Note that the storage units are configured in the same way, and so are the readout units; thus, the storage units 200 and the readout units 300 above the image sensor 1000 are omitted from the drawings.

Each storage unit 200 is composed of storage circuits 204, 205, 206. The storage circuit 204 includes capacitors C7 to C12, the storage circuit 205 includes capacitors C13 to C18, and the storage circuit 206 includes capacitors C19 to C24. Note that the capacitors C7 to C24 have the same capacitance value.

In the focus detection readout mode shown in FIG. 10, signals of photodiodes 101A of pixels in the first, third, and fifth columns are input to the storage circuit 204. Thus, similarly to the case of FIG. 5B, the storage circuit 204 stores a signal obtained by averaging A image signals of the pixels in the first, third, and fifth columns. Signals of photodiodes 101B of the pixels in the first, third, and fifth columns are input to the storage circuit 206. Thus, the storage circuit 206 stores a signal obtained by averaging B image signals of the pixels in the first, third, and fifth columns. Signals of the photodiodes 101A and 101B of the pixels in the first, third, and fifth columns are input to the storage circuit 205. Thus, the storage circuit 205 stores a signal obtained by averaging the signals of the photodiodes 101A and 101B of the pixels in the first, third, and fifth columns. As a product of this signal and a doubling gain can be used as an A+B image signal, this signal is referred to as the A+B image signal. That is to say, the storage circuit 205 stores a signal obtained by averaging A+B image signals of the pixels in the first, third, and fifth columns.

The A image signal, A+B image signal, B image signal stored in the storage circuits 204, 205, 206 undergo A/D conversion and S−N processing in the corresponding readout circuits, and are output to the outside of the image sensor in parallel via digital signal lines 307, 308, 309, respectively. In this case, driving timings are similar to those described in the first embodiment, and thus a description thereof is omitted.

In the normal readout mode shown in FIG. 11, signals of the photodiodes 101A and 101B of the pixel in the first column are input to the storage circuit 204. Thus, the storage circuit 204 stores a signal obtained by averaging the signals of the photodiodes 101A and 101B of the pixel in the first column. As a product of this signal and a doubling gain can be used as an A+B image signal, this signal is referred to as the A+B image signal. That is to say, the storage circuit 204 stores the A+B image signal of the pixel in the first column. Similarly, the storage circuit 205 receives, as input, signals of the photodiodes 101A and 101B of the pixel in the third column, and thus stores an A+B image signal of the pixel in the third column. The storage circuit 206 receives, as input, signals of the photodiodes 101A and 101B of the pixel in the fifth column, and thus stores an A+B image signal of the pixel in the fifth column.

The A+B image signals stored in the storage circuits 204, 205, 206 undergo A/D conversion and S−N processing in the readout circuits 301, 302, 303, and are output to the outside of the image sensor in parallel via the digital signal lines 307, 308, 309, respectively. In this case, driving timings are similar to those described in the first embodiment, and thus a description thereof is omitted.

By using the above-described configuration, one readout unit can be shared among three columns, and thus an increase in the circuit scale can be suppressed. The focus detection readout mode for outputting the A+B image signal, A image signal, and B image signal obtained by averaging signals of three pixels in the horizontal direction can be used in, for example, a moving image mode for performing a focus detection operation, whereas the normal readout mode for outputting only A+B image signals without averaging signals of three pixels in the horizontal direction can be used in a still image capture mode.

Furthermore, in the present embodiment also, the generation of a captured image and the focus detection operation can be performed in parallel as the A+B image signal, A image signal, and B image signal are output in parallel. As a result, the focus detection operation and the generation of the captured image can be performed at a high frame rate.

Fourth Embodiment

The above first to third embodiments have described a configuration in which the storage units 200 and the readout units 300 are provided in one-to-one correspondence with the columns, and pixel signals are read out and undergo A/D conversion sequentially on a row-by-row basis. In contrast, the present embodiment describes a configuration in which storage units 200 and readout units 300 are provided in one-to-one correspondence with pixels. With this configuration, readout can be performed at a higher speed as pixel signals can be readout and undergo A/D conversion simultaneously for all pixels.

Figure 12:
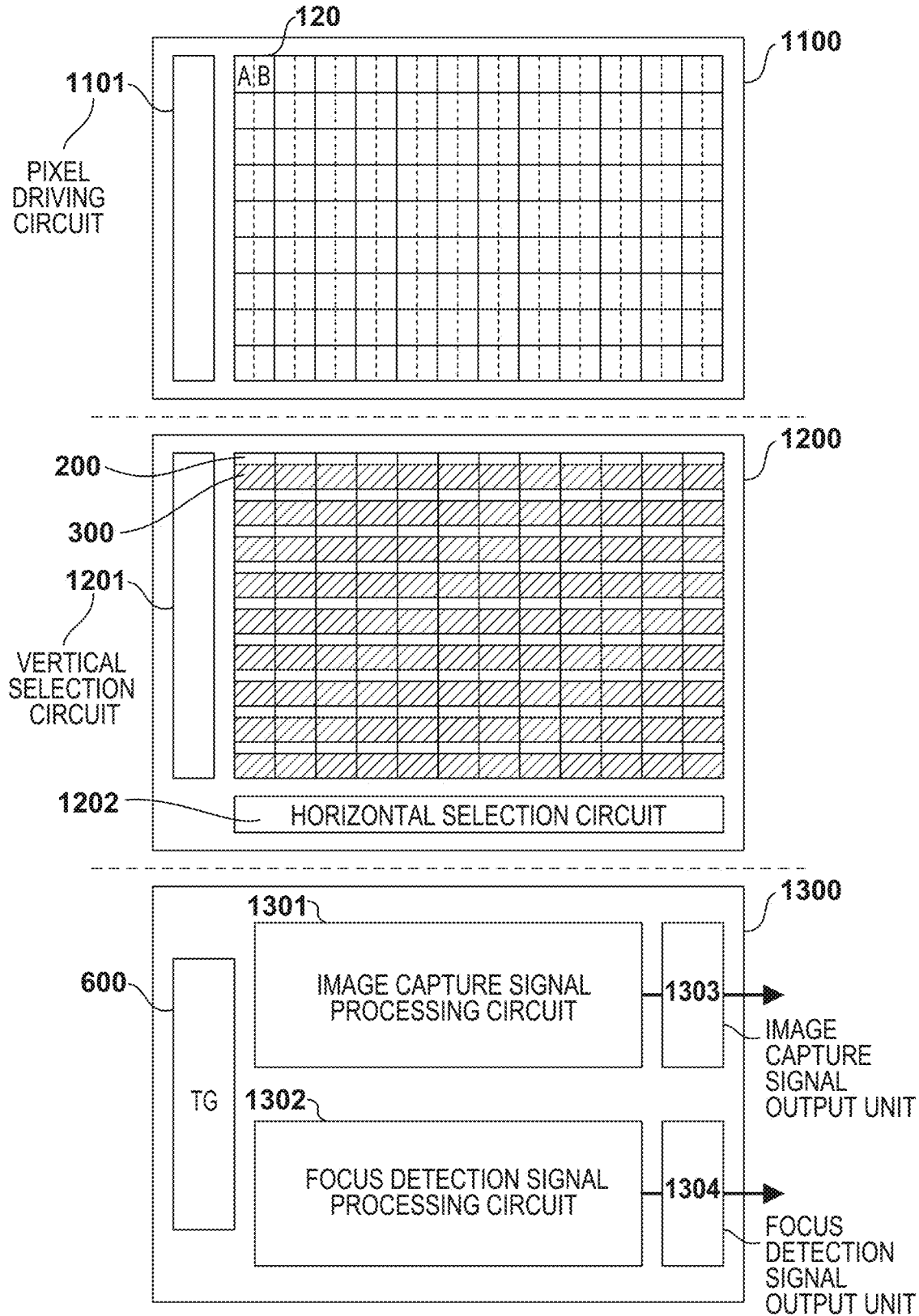
FIG. 12 is block diagram showing an example of an overall configuration of an image sensor according to a fourth embodiment of the invention.

FIG. 12 shows an example of an overall configuration of an image sensor 1000 according to a fourth embodiment. A detailed description of portions that are identical to those of the first embodiment is omitted. As one example, it will be assumed that the image sensor 1000 according to the present embodiment is constructed by stacking a plurality of semiconductor chips, that is to say, a pixel region chip 1100, a readout circuit chip 1200, and a signal processing chip 1300. The chips are electrically wired to one another via, for example, microbumps using a known substrate stacking technique. Note that in the above first to third embodiments also, the image sensor 1000 may be configured to have a stacked structure.

The pixel region chip 1100 includes a pixel region and a pixel driving circuit 1101, and a plurality of pixel units 120 that each have two photodiodes are arrayed in the pixel region. The pixel driving circuit 1101 transmits a driving signal collectively to all pixels in the pixel region. The readout circuit chip 1200 includes storage units 200, readout units 300, a vertical selection circuit 1201, and a horizontal selection circuit 1202. The storage units 200 and the readout units 300 are provided in one-to-one correspondence with the pixel units. Similarly to the first embodiment, each storage unit 200 includes a storage circuit 201 for an A image signal, a storage circuit 202 for an A+B image signal, and a storage circuit 203 for a B image signal. Similarly to the first embodiment, each readout unit 300 includes a readout circuit 301 for the A image signal, a readout circuit 302 for the A+B image signal, and a readout circuit 303 for the B image signal. As a pair, the vertical selection circuit 1201 and the horizontal selection circuit 1202 select one readout unit 300, and the A+B image signal, A image signal, and B image signal stored in the selected readout unit 300 are output to an image capture signal processing circuit 1301 and a focus detection signal processing circuit 1302, which will be described later.

The signal processing chip 1300 includes a TG 600, the image capture signal processing circuit 1301, the focus detection signal processing circuit 1302, an image capture signal output unit 1303, and a focus detection signal output unit 1304. The image capture signal processing circuit 1301 applies various types of signal processing to the A+B image signal output from any readout unit 300. The focus detection signal processing circuit 1302 applies various types of signal processing to the A image signal and B image signal output from any readout unit 300. It also calculates a phase difference (an image shift amount) between the A image signal and B image signal by carrying out known correlation computation using the A image signal and B image signal. The image capture signal output unit 1303 outputs the A+B image signal that has undergone signal processing in the image capture signal processing circuit 1301 to the outside of the image sensor as an image capture signal. The output image capture signal is used by a control unit 1004 to generate a captured image. The focus detection signal output unit 1304 outputs the result of correlation computation by the focus detection signal processing circuit 1302 to the outside of the image sensor 1000. The output result of correlation computation is used by the control unit 1004 to calculate a defocus amount of an image capture lens, and a driving amount of the image capture lens is determined based on the result of calculation. These image capture signal processing and focus detection signal processing are executed in parallel.

Note that in some cases, correlation computation for focus detection is carried out after converting color signals into luminance signals. In view of this, the focus detection signal processing circuit 1302 may execute computation processing for converting the A image signal and B image signal of each color into luminance signals. For example, luminance signals YA, YB are generated by calculating luminance values through application of Bayer merging to the A image signal and B image signal. As signals corresponding to a Bayer pattern are necessary in computation of luminance values, the A image signal and B image signal of each color that have been input to the focus detection signal processing circuit 1302 are stored in a memory until all of the signals necessary for the computation are obtained. That is to say, as signals in a row corresponding to G and B are read out after signals in a row corresponding to R and G are read out, it is sufficient to store the A image signal and B image signal in the row corresponding to R and G to the memory first, and once the signals in the row corresponding to G and B have been read out, compute luminance signals YA, YB sequentially. Correlation computation is carried out using the calculated luminance signals YA, YB.

The present embodiment adopts a configuration in which the storage unit and the set of readout circuits for the A+B image signal, A image signal, and B image signal are provided on a pixel-by-pixel basis; by forming the pixel region on a chip separate from a chip of the storage units and the readout circuits as shown in FIG. 12, the area of a pixel circuit can be secured, and a decrease in an aperture ratio of each pixel can be prevented.

Figure 13A:
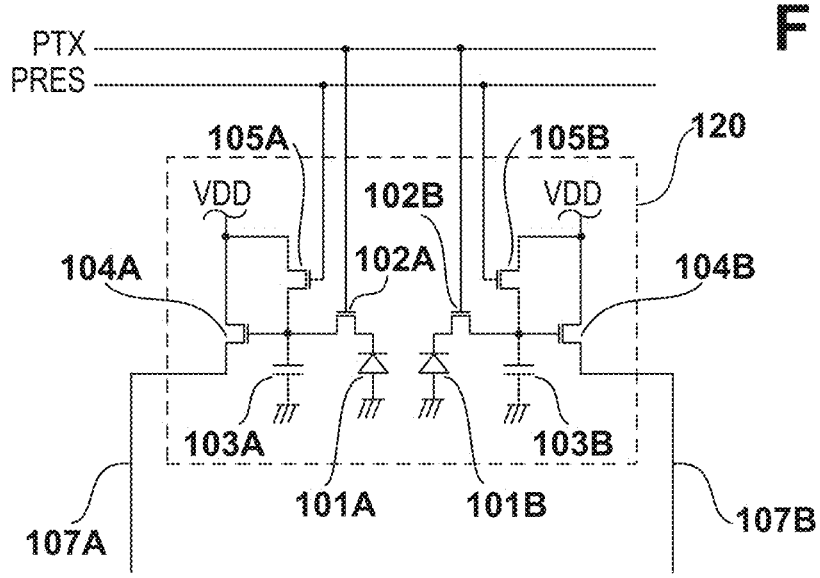
FIG. 13A shows an example of a circuit configuration of pixel units.

FIG. 13A is a circuit diagram of the pixel units 120 according to the fourth embodiment. This figure corresponds to FIG. 4 of the first embodiment, and is identical to FIG. 4 except that selection switches are not provided; thus, a detailed description thereof is omitted.

Figure 13B:
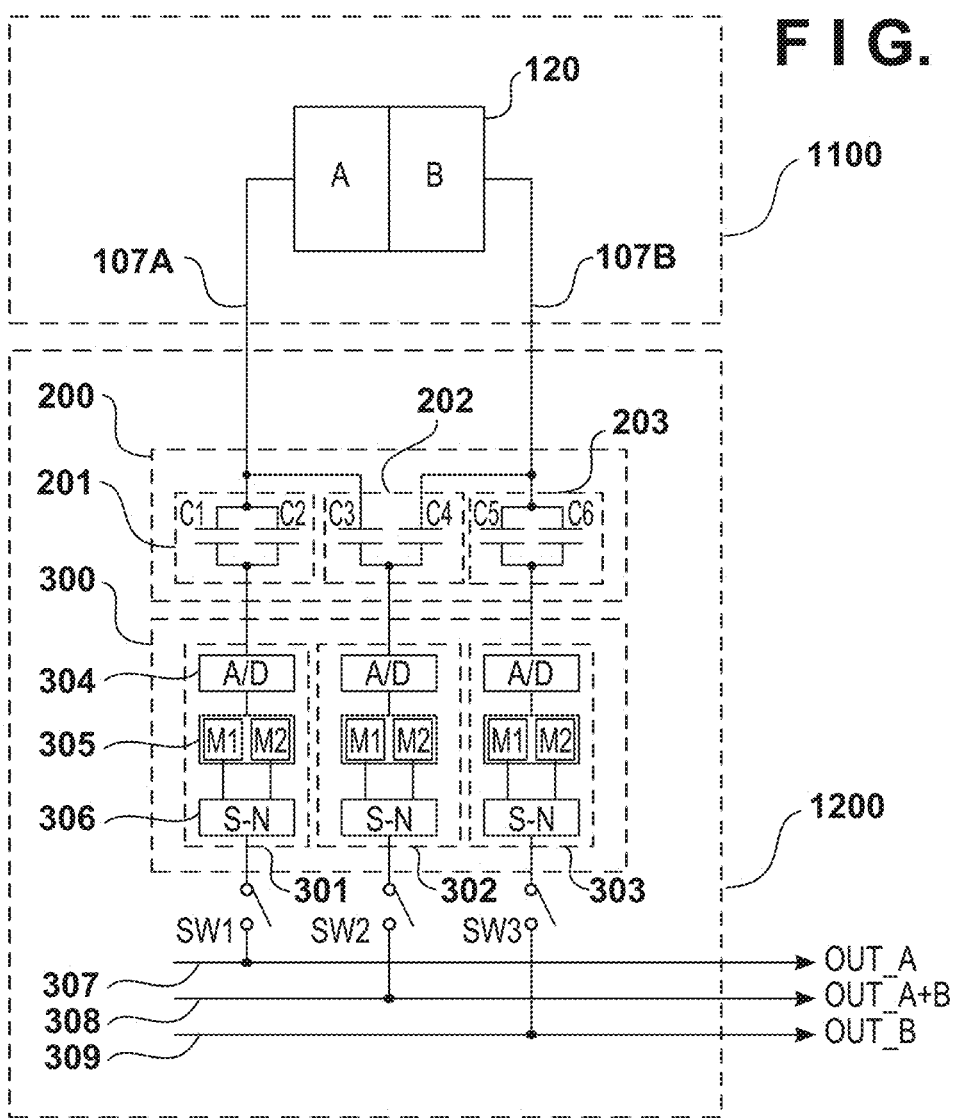
FIG. 13B shows examples of configurations of the pixel units, storage units, and readout units, in the image sensor according to the fourth embodiment of the invention.

FIG. 13B shows configurations of the pixel units 120, the storage units 200, and the readout units 300 according to the fourth embodiment. This figure corresponds to FIG. 5A of the first embodiment, and a detailed description of portions that are identical to those in FIG. 5A is omitted. As shown in FIG. 13B, the readout circuit chip 1200 includes the storage units 200 and the readout units 300 that are in one-to-one correspondence with the pixel units 120 of the pixel region chip 1100. Each storage unit 200 includes the storage circuit 201 for storing the A image signal, the storage circuit 202 for storing the A+B image signal, and the storage circuit 203 for storing the B image signal. Each readout unit 300 includes the readout circuit 301 for the A image signal, the readout circuit 302 for the A+B image signal, and the readout circuit 303 for the B image signal. A/D conversion processing and S–N processing are executed in parallel in each readout circuit. After the S–N processing, switches SW1 to SW3 of the readout unit selected by the pair of the vertical selection circuit 1201 and the horizontal selection circuit 1202 are turned on, and the A+B image signal is output to the image capture signal processing circuit 1301 of the signal processing chip 1300 via a digital signal line 308. The A image signal and B image signal are output to the focus detection signal processing circuit 1302 of the signal processing chip 1300 via digital signal lines 307 and 309.

Note that a driving timing chart for an image capturing apparatus 10 according to the fourth embodiment is mostly similar to that of FIG. 6. A difference from FIG. 6 is that a selection pulse signal PSEL and control signals PSW4 to PSW6 for switches SW do not exist. In FIG. 6 of the first embodiment, driving pulses are transmitted to pixels in a row selected by the selection pulse signal PSEL; on the other hand, in the present fourth embodiment, driving pulses are transmitted simultaneously to all pixels. Then, A/D conversion and S–N processing are performed in parallel for all pixels. Thereafter, the switches SW1 to SW3 of the readout unit 300 selected by the pair of the vertical selection circuit 1201 and the horizontal selection circuit 1202 are turned on, and the A+B image signal, A image signal, and B image signal of the corresponding pixel are output to the signal processing chip 1300. In the present embodiment, as the readout units 300 are provided in one-to-one correspondence with the pixel units, a switch SW4 and subsequent switches do not exit.

As described above, in the present embodiment, readout can be performed at a higher speed as pixel signals can be read out and undergo A/D conversion simultaneously for all pixels. Furthermore, in the present embodiment also, a focus detection operation and the generation of a captured image can be performed in parallel as the A+B image signal, A image signal, and B image signal are output in parallel. As a result, the focus detection operation and the generation of the captured image can be performed at a high frame rate.

Although the present embodiment adopts a configuration in which the storage unit and the set of readout circuits for the A+B image signal, A image signal, and B image signal are provided on a pixel-by-pixel basis, the present embodiment may alternatively adopt a configuration in which the storage unit and the set of readout circuits for the A+B image signal, A image signal, and B image signal are shared among a plurality of pixels, as an application of the third embodiment.

Although the present first to fourth embodiments have described a configuration in which two photoelectric conversion portions are provided within each pixel unit, the number of photodiodes within each pixel unit is not limited to two. For example, the following configuration may be adopted: four photodiodes are provided within each pixel unit, four storage circuits and four readout circuits are provided for focus detection, and one storage circuit and one readout circuit are provided for an image capture signal. That is to say, provided that the number of photoelectric conversion portions within each pixel unit is N, the total number of storage circuits and the total number of readout circuits necessary for focus detection and the image capture signal are N+1 each. Furthermore, provided that the number of photoelectric conversion portions is N, in an embodiment corresponding to the third embodiment, a pair of a storage unit 200 and a readout unit 300 is provided per set of N+1 columns, and the number of storage circuits in each storage unit 200 and the number of readout circuits in each readout unit 300 are N+1 each. For example, when N is four, a pair of a storage unit 200 and a readout unit 300 is provided per set of five columns, each storage unit 200 includes five storage circuits, and each readout unit 300 includes five readout circuits.

Although the embodiments of the present invention have been described thus far, the present invention is by no means limited to these embodiments.

While the present invention has been described with reference to embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application Nos. 2015-000511, filed Jan. 5, 2015 and 2015-241409, filed Dec. 10, 2015, which are hereby incorporated by reference herein in their entirety.

What is claimed is:

1. An image capturing apparatus, comprising:
   a plurality of pixels respectively comprising a plurality of photoelectric conversion portions and outputting a first voltage signal based on charges of a part of photoelectric conversion portions among the plurality of photoelectric conversion portions and a second voltage signal based on charges of the photoelectric conversion portions other than the part of photoelectric conversion portions among the plurality of photoelectric conversion portions; and
   a plurality of storage circuits respectively provided in one-to-one correspondence with each of the plurality of pixels and storing voltage signals based on the charges generated by the plurality of photoelectric conversion portions,
   wherein each of the plurality of storage circuits comprises a plurality of storage units including a first storage unit for storing the first voltage signal and a second storage unit for storing the second voltage signal.

2. The image capturing apparatus according to claim 1, wherein each of the plurality of storage circuits further comprises a third storage unit for storing a third voltage signal based on the charges of the part of photoelectric conversion portions among the plurality of the photoelectric conversion portions and the charges of photoelectric conversion portions other than the part of photoelectric conversion portions.

3. The image capturing apparatus according to claim 1, wherein each of the plurality of pixels comprises a microlens and the plurality of photoelectric conversion portions divide a pupil area of a photographing optical system to receive light.

4. The image capturing apparatus according to claim 1, wherein a number of the plurality of storage units arranged in each of the plurality of storage circuits is more than a number of the plurality of photoelectric conversion portions arranged in each of the plurality of pixels.

5. The image capturing apparatus according to claim 1, wherein the image capturing apparatus is composed by stacking a plurality of semiconductor substrates, and the plurality of pixels are arranged on a first semiconductor substrate among the plurality of semiconductor substrates, and the plurality of storage circuits are arranged on a second semiconductor substrate among the plurality of semiconductor substrates.

6. An image capturing apparatus comprising:
   a plurality of pixels respectively comprising a plurality of photoelectric conversion portions and outputting a first voltage signal based on charges of a part of photoelectric conversion portions among the plurality of photoelectric conversion portions and a second voltage signal based on the charges of the part of photoelectric conversion portions among the plurality of photoelectric conversion portions and charges of the photoelectric conversion portions other than the part of photoelectric conversion portions; and
   a plurality of storage circuits respectively provided in one-to-one correspondence with each of the plurality of pixels and storing voltage signals based on the charges generated by the plurality of photoelectric conversion portions,
   wherein each of the plurality of storage circuits comprises a plurality of storage units including a first storage unit for storing the first voltage signal and a second storage unit for storing the second voltage signal.

7. The image capturing apparatus according to claim 6, wherein each of the plurality of pixels comprises a microlens and the plurality of photoelectric conversion portions divide a pupil area of a photographing optical system to receive light.

8. The image capturing apparatus according to claim 6, wherein a number of the plurality of storage units arranged in each of the plurality of storage circuits is more than a number of the plurality of photoelectric conversion portions arranged in each of the plurality of pixels.

9. The image capturing apparatus according to claim 6, wherein the image capturing apparatus is composed by stacking a plurality of semiconductor substrates, and the plurality of pixels are arranged on a first semiconductor substrate among the plurality of semiconductor substrates, and the plurality of storage circuits are arranged on a second semiconductor substrate among the plurality of semiconductor substrates.

\* \* \* \* \*